United States Patent [19]
Kushida

[11] Patent Number: 5,604,579
[45] Date of Patent: Feb. 18, 1997

[54] METHOD AND APPARATUS FOR ELECTRONICALLY CREATING IMPOSITION DATA, INCLUDING DUMMY DATA FOR ORIGINAL FILM AND PLATEMAKING

[75] Inventor: Masahiko Kushida, Minami-ku, Japan

[73] Assignee: Dainippon Screen Manufacturing Co., Ltd., Japan

[21] Appl. No.: 299,898

[22] Filed: Sep. 1, 1994

[30] Foreign Application Priority Data

Sep. 6, 1993 [JP] Japan ..................................... 5-221137
Jul. 11, 1994 [JP] Japan ..................................... 6-158978

[51] Int. Cl.$^6$ .......................... H04N 1/00; H04N 1/387; G03B 27/52; G06K 1/00
[52] U.S. Cl. .................... 355/400; 358/400; 358/450; 358/452; 358/296; 358/540; 355/40; 355/54; 395/117; 395/133; 395/761
[58] Field of Search ................................ 358/448, 447, 358/450, 452, 453, 461, 462, 467, 400, 449, 296, 298, 299, 540; 395/133, 135, 117, 147; 355/54, 40

[56] References Cited

U.S. PATENT DOCUMENTS

| | | |
|---|---|---|
| 4,094,680 | 6/1978 | Frazier . |
| 5,027,225 | 6/1991 | Kurihara et al. ........................ 358/448 |
| 5,231,516 | 7/1993 | Kamon et al. ........................... 358/444 |

FOREIGN PATENT DOCUMENTS

| | | |
|---|---|---|
| 0348908 | 6/1989 | European Pat. Off. . |
| 0557004 | 2/1993 | European Pat. Off. . |
| 0557008 | 2/1993 | European Pat. Off. . |
| 0574914 | 6/1993 | European Pat. Off. . |
| 4205301 | 2/1992 | Germany . |

OTHER PUBLICATIONS

Aldus Photostyler, Mar. 1992, pp. 84–86.

*Primary Examiner*—Kim Vu
*Assistant Examiner*—Kimberly A. Williams
*Attorney, Agent, or Firm*—Ostrolenk, Faber, Gerb & Soffen, LLP

[57] ABSTRACT

The platemaking system is a system that produces a printing plate by using an exposure device 8 to print on original film that has imposition data consisting of multiple page data imposed on photosensitive film. The system is equipped with page data layout device 2 and exposure device 8. Page data layout device 2 indicates page layout data that contains positioning information and size information of each page data for the purpose of impositioning multiple page data on photosensitive film. Based on that page layout data, each page data is laid out at the imposition position of the photosensitive film, imposition data is created and the indicated page layout data is output to exposure device 8. Exposure device 8 receives the page layout data via network line NL and moves the original film to the corresponding position in accordance with the received page layout data after which the exposure process is carried out. The device is equipped with keyboard 14 to indicate page layout data for the purpose of impositioning multiple page data on original film. Page data layout device 2 lays out corresponding page data in response to page layout data when the page data corresponding to the page number specified by page layout data is prepared and then creates imposition data. Further, when the page data is not prepared, page data layout device 2 lays out dummy page data in response to page layout data in place of page data and then creates imposition data.

10 Claims, 25 Drawing Sheets

SM

PR   R

Fig. 24
(A)
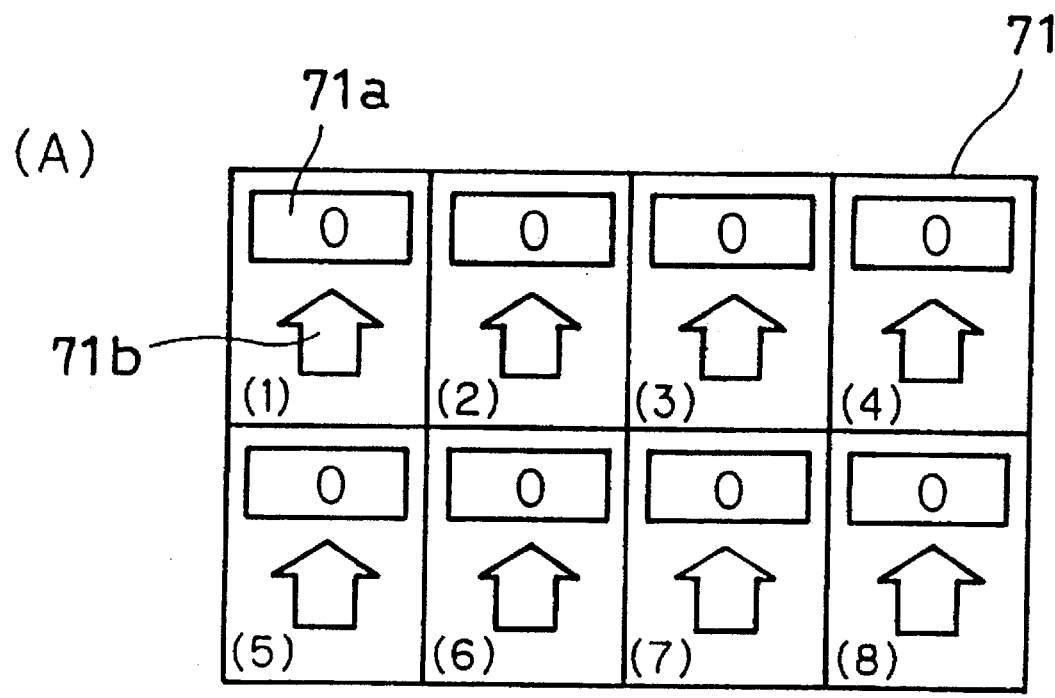
(B)
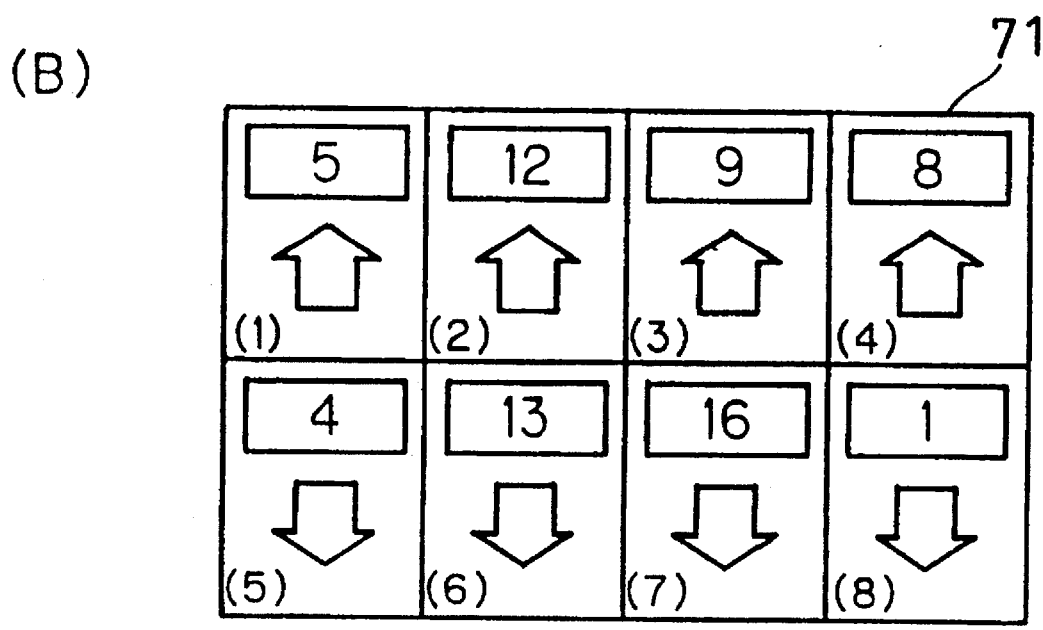

METHOD AND APPARATUS FOR ELECTRONICALLY CREATING IMPOSITION DATA, INCLUDING DUMMY DATA FOR ORIGINAL FILM AND PLATEMAKING

BACKGROUND OF THE INVENTION

The invention relates to method and apparatus for creation of imposition data, original film creation, and platemaking, where printing plates produced are to be used in a printing process. In particular the system and method relate to an imposition data creation device that creates imposition data of multiple pages of data where one or more of the pages of subsequently printed matter may not be available yet. The system lays out dummy page data for the missing page or pages. Further, the device uses the method for laying out each page of page data onto an original film and transfers the images on each original film to determined positions on a printing plate.

DESCRIPTION OF RELATED ART

When creating printed matter such as, for instance, a book, a pamphlet or a magazine, multiple pages of data such as text, patterns, designs and characters are each recorded at prescribed positions on an original film. Subsequently, a printing plate is created from the original film. The plate is used to print multiple pages of printed matter on a single piece of paper, the piece of paper may then be folded and some or all of its folded edges cut, to form a plurality of sequential printed pages. For example, to create a bound book, 16 page units are printed, each 16 page, unit being formed from a single sheet of paper having 8 sections of printed mater on each side, with two columns of four page portions. The piece of paper is folded eight times and then cut to provide sixteen sequential pages of the book. A plurality of these sequential sixteen page segments may be bound together to form the book.

To properly produce a single side of a sheet of paper having eight pages printed on each side, each page must be properly oriented with each of the pages printed on both the front side and the back side of the paper, so that with proper folding of the paper, the pages wind up in sequential order after folding and cutting. Thus, for each uncut sheet of paper, it is necessary to properly impose eight pages or page images onto a single original film in order to produce a printing plate which is used to print on one side of one sheet of paper.

The process of creating an original film has typically been performed by a film stripper. A film stripper manually takes each page, one by one and organizes the pages to produce an original film. Thus, in order to perform the imposing process, the operator puts each of the eight pages of data onto one original film.

In contrast to this, in recent years it has become possible to use a computer to automatically surface orient, and mount each page of data onto an original film. In such computer systems, each page of data is laid out in memory based on information such as the page number and page position as well as position and size imposition data automatically created by the computer. By utilizing this type of imposition data, an operator need not use his hands to do the imposing.

As stated above, when a computer is used to automatically carry out an imposing operation, the imposing can be carried out with little problem if the printed matter on each page is prepared in advance. However, in the actual printing and binding process, there is a possibility the one or more pages will not be complete or may need revision after the original film creation process has begun. In some computer systems, it may be not be possible to create an original film with one or more portions or pages missing.

SUMMARY OF THE INVENTION

One object of the invention is to make the exposure process of producing printing plates from an original film more efficient when one or more page of data are missing from the original film.

In a first embodiment of the present invention, a plate making system includes a imposition data creation device and an exposure device which prints original film based upon data created in the imposition data creation device. The imposition data creation device creates data corresponding to a plurality of page impositions. Each original film is formed of a photosensitive film having image related information thereon, produced in accordance with at least one page of page data.

The imposition data creation device is provided with an indication method, page layout method and imposition information output method. The indication method indicates page layout data that contains positioning information and size information of each page imposition for the purpose of imposing multiple pages of data onto the photosensitive film. The page layout method is a method to layout each page of data at the proper imposition position on the photosensitive film and create imposition data based on the page layout data from the indication method. The information output method outputs page layout data indicated by the indication method to the exposure device.

In another aspect of the invention, the device uses the page layout method to layout the corresponding page data in response to the page layout data when the page data corresponding to the imposition position specified by the page layout data is prepared and then creates imposition data. Further, when the page data is not prepared, it lays out a dummy page data in response to page layout data in place of missing page imposition data in the from of a shaded region on the appropriate area of the original film and then creates imposition data.

Included with the imposition data creation device is a platemaking system that uses an exposure device to create a printing plate using the imposition data and multiple page data. Further, this device is equipped with an indication method, page layout method and information output method. The indication method indicates page layout data that contains positioning information and size information of each page imposition for the purpose of imposing multiple page data on a printing plate. The page layout method lays out a page data at the imposition position of the printing plate and create imposition data based on the page layout data indicated in the indication method. The information output method outputs page layout data indicated by the indication method to the exposure device.

The imposition data creation device uses the page data layout method to layout the corresponding page data in response to the page layout data when the page data corresponding to the imposition position specified by the page layout data is prepared and then creates imposition data. Further, when the page data is not prepared, it lays out dummy page data in response to page layout data in place of page data which contains data that has an unexposed region on the area laid out on the printing plate and then creates imposition data.

The platemaking system of the present invention creates imposition data consisting of multiple page data for the purpose of creating original film from photosensitive film along with obtaining a printing plate from file original film. The system is also equipped with a imposition data creation device and a exposure device. The imposition data creation device has an indication method to indicate page layout data that contains positioning information and size information of each page of data for the purpose of imposing multiple pages of data on photosensitive film. The imposition data creation device also has a page data layout method to layout each page of data at the imposition position of the photosensitive film and create imposition data based on the page layout data indicated in the indication method. And the device has an information output method to output page layout data indicated by the indication method.

The exposure device creates a printing plate from an original film which has recorded thereon multiple pages of data and can be connected to the information output method via a communication line. The exposure device has an information receiving method to receive page layout data output from the information output method and a printing method to transport the original film to the corresponding position in response to the page layout data received by the information receiving method.

The platemaking system uses the page imposition layout method to layout the corresponding page of data in response to the page layout data when the page of data corresponding to the imposition position specified by the page layout data is prepared and then creates imposition data. Further, when the page data is not prepared, it lays out dummy page data in response to page layout data in place of page data which contains data that has a shaded region on the area laid out on the original film and then creates imposition data.

The platemaking system is also equipped with a shading method to shade prescribed regions excluding regions laid out with dummy page data in response to size information and positioning information contained in page layout data by said exposure device.

When page layout data that contains positioning information and size information of each page data is indicated by the indication method in the imposition data creation device, page of data created beforehand is laid out corresponding to the imposition position (stored in memory) on the photosensitive film after which imposition data is created. Further, page layout data indicated by the indication method is output to the exposure device by the information output method.

Because the page layout data is output by the information method to the exposure device at this point, for instance, even if the exposure process is divided into two parts in order to obtain one printing plate, when the later original film is laid out in the prescribed position for the exposure device, page layout data can be used to layout the original film automatically and accurately.

In the imposition data creation device, when the page data corresponding to the imposition position indicated by the page layout data is prepared, the page data that corresponds with the page data layout method is laid out in response to the page layout data. Further, when the page data is not prepared, the device lays out dummy page data in response to page layout data in place of page data in order to form a shaded region and then creates imposition data.

At this point, even if a page data of a certain page is not prepared, surface mount data is created for completed page data only and based on that data, original film can be created. Further, on the exposure device side, when the exposure process is carried out on a area excluding the dummy page data area, the dummy page data area will become a shaded region so a mask for this area is not necessary. Further, when original film that was created later is printed one over the other at the area where the dummy page data was printed, the original film is automatically and accurately laid out at a corresponding position in accordance with page layout data from the information output method of the imposition data creation device.

When page layout data that contains positioning information and size information of each page imposition is indicated by the indication method in the imposition data creation device, page data created beforehand is laid out corresponding to the imposition position (stored in memory) on the printing plate after which imposition data is created. Further, page layout data indicated by the indication method is output to the exposure device by the information output method.

Because the page layout data is output by the information method to the exposure device at this point, for instance, even if the exposure process is divided into two parts in order to obtain one printing plate, when the later original film is laid out in the prescribed position for the exposure device, page layout data can be used to layout the original film automatically and accurately.

In the imposition data creation, when the page imposition corresponding to the imposition position indicated by the page layout data is prepared, these page impositions are laid out in response to the page layout data. Further, when the page data is not prepared, the device lays out dummy data in response to page layout data in place of page data in order to form an unexposed region and then creates imposition data.

At this point, even if page data of a certain page is not prepared, imposition data is created for completed page data only and based on that data, a printing plate can be created. Further, when original film that was created later is printed one over the other in the area where the dummy page data was printed, the original film is automatically and accurately laid out at a corresponding position in accordance with page layout data from the information output method of the imposition data creation device.

When the page layout data is indicated in the platemaking system, imposition data is created based on that page layout data. Further, the page layout data is output to the exposure device. The page layout data that was output is then received by an information receive method of file exposure device. The original film is transported to the corresponding position in response to the page layout data received after which exposure processing is carried out.

At this point, the original film can be transported based on the page layout data being sent from the imposition data creation device making the positioning operation of the original film unnecessary. As a result, the operation efficiency during printing increases with a more accurate exposure process.

When a page data is prepared in the platemaking system, each page data is laid out in response to the page layout data. Further, when the page data is not prepared, dummy page data is laid out in response to page layout data in place of page data in order to form a shaded region and then create imposition data. Also, original film created by imposition data containing dummy page data is laid out at a prescribed position in accordance with page layout data sent from the imposition data creation device after which the exposure process is carried out.

At this point, when a region is exposed that excludes dummy page data, a mask of the dummy page data area is not necessary and when original film that was created later is printed one over the other at the area where the dummy page data was exposed, the original film can be automatically and accurately laid out at a corresponding position in accordance with page layout data from the information output method of the imposition data creation device and the operation on the exposure device side carried out more accurately and efficiently.

When original film containing a dummy page data area is exposed, the region excluding the dummy page data area is shaded by the shading method in response to size information and positioning information contained in the page layout data and since the exposure process is carried out, efficiency during the exposure process is improved.

In another aspect of the present invention, when a imposing is done and one or more page data are missing or incomplete, there is a possibility an original film of the missing portion or page itself may be supplied. The imposition data creation device creates imposition data consisting of multiple page data laid out corresponding to a imposition on original film. The device includes an indication method to indicate page layout data to imposition multiple page data on original film as well as a page data layout method. The page data layout method lays out corresponding page data in response to page layout data when the page data corresponding to the page number specified by imposition when the page data is not prepared, the data layout method lays out dummy page data in response to page layout data in place of page data and then creates imposition data.

In the imposition data creation device, multiple page data created by the page data creation method in accordance with page layout data indicated by the indication method imposition data is created are laid out by the data layout method after which imposition data is created. During this operation, the data layout method lays out corresponding page data in response to page layout data when the page data corresponding to the page number specified by page layout data is prepared and then creates imposition data. Further, when the page data is not prepared, the data layout method lays out dummy page data in response to page layout data in place of page imposition and then creates imposition data. The data created for the dummy page data is such that the subsequently produced original film includes a transparent area corresponding to the missing page data.

BRIEF DESCRIPTION OF THE DRAWINGS

FIG. 24 a plane view of a screen display of from a portion of a page layout creation process depicted in FIG. 22.

DETAILED DESCRIPTION OF THE PREFERRED EMBODIMENTS

Figure 1:
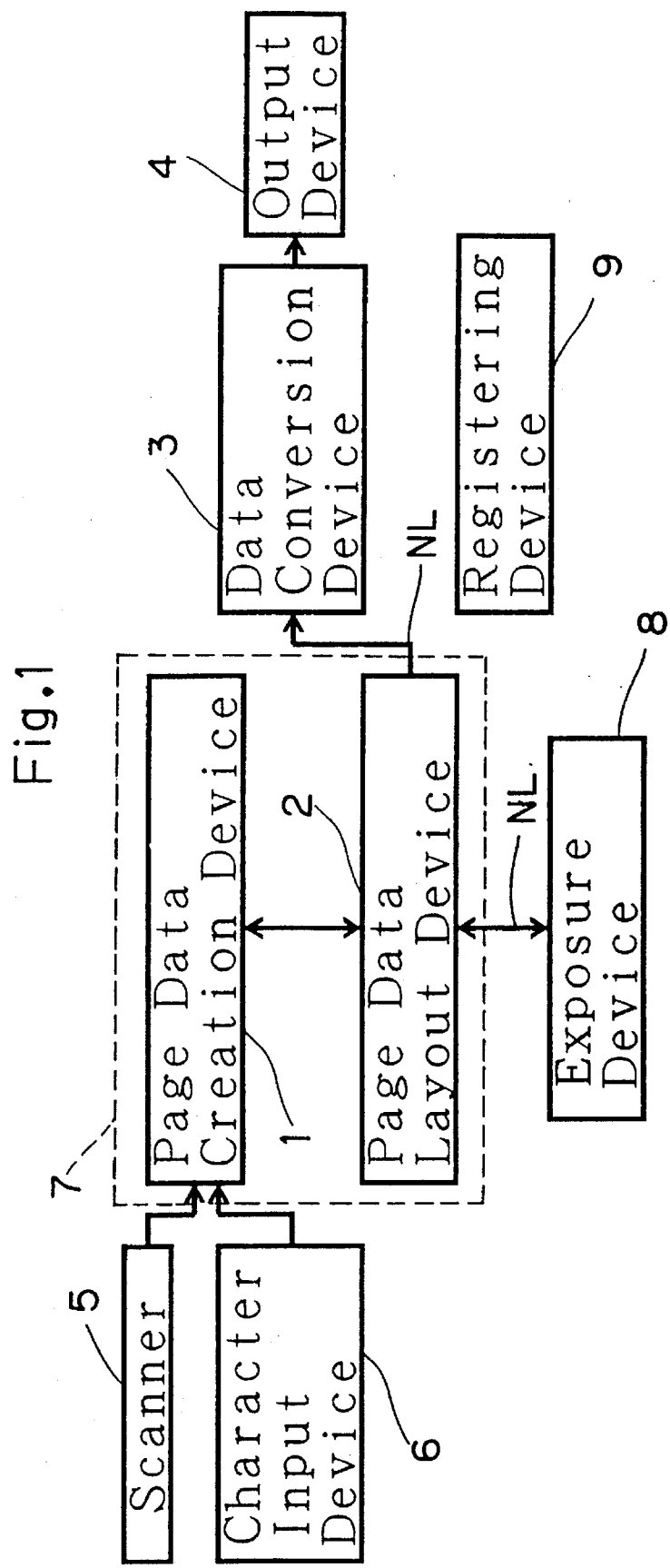
FIG. 1 is a block diagram representing a platemaking system that creates printing plates in accordance with one aspect of the present invention.

As shown in FIG. 1, where like reference numerals refer to like elements throughout the various figures, there is a configuration of a platemaking system containing a imposition data creation device using one embodiment of the present invention. This platemaking system has a data creation device 7 which includes a page data creation device 1 and page data layout device 2. It also has data conversion device 3, output device 4, exposure device 8 and registration device 9. Page data creation device 1 is a device that creates page data of each page. Further, page data layout device 2 is a device that creates page layout data to determine what position to layout a page data created by the page data creation device on photosensitive film after which it creates imposition data based on the page layout data.

A scanner 5 and a character input device 6 are connected to the page data creation device 1 to input patterns and design information. Page data creation device 1 has a microcomputer, for instance a microprocessor in a personal computer or the like, that includes a DTP (Desk Top Publishing) program and word processor program associated therewith. It creates page data, each page of subsequently printed data having a related page number.

Page data of each page created by page data creation device 1 are treated as imposition data laid out by page data layout device 2 corresponding to the layout imposition on the photosensitive film based on page layout data. Further, the imposition data that was created is sent to data conversion device 3, via network line NL. Data conversion device 3 is a device to convert previously inputted imposition data to raster data. The converted raster data is sent to output device 4 by data conversion device 3.

Photosensitive film is mounted to output device 4 and an image based on the raster data from data conversion device 3 is recorded on this photosensitive film to create the original film. Further, page layout data created by page data layout device 2 is sent to exposure device 8 via network line NL. It should be understood that the network line NL could be any of a variety of communication lines, such as a SCSI bus, RS-232 or the like. Exposure device 8 is a device to expose the printing plate to the original film created by output device 4. Registration device 9 is a device to able to form punch holes in the mounting original film having recorded page data formed by output device 4 based on a registration mark.

Figure 2:
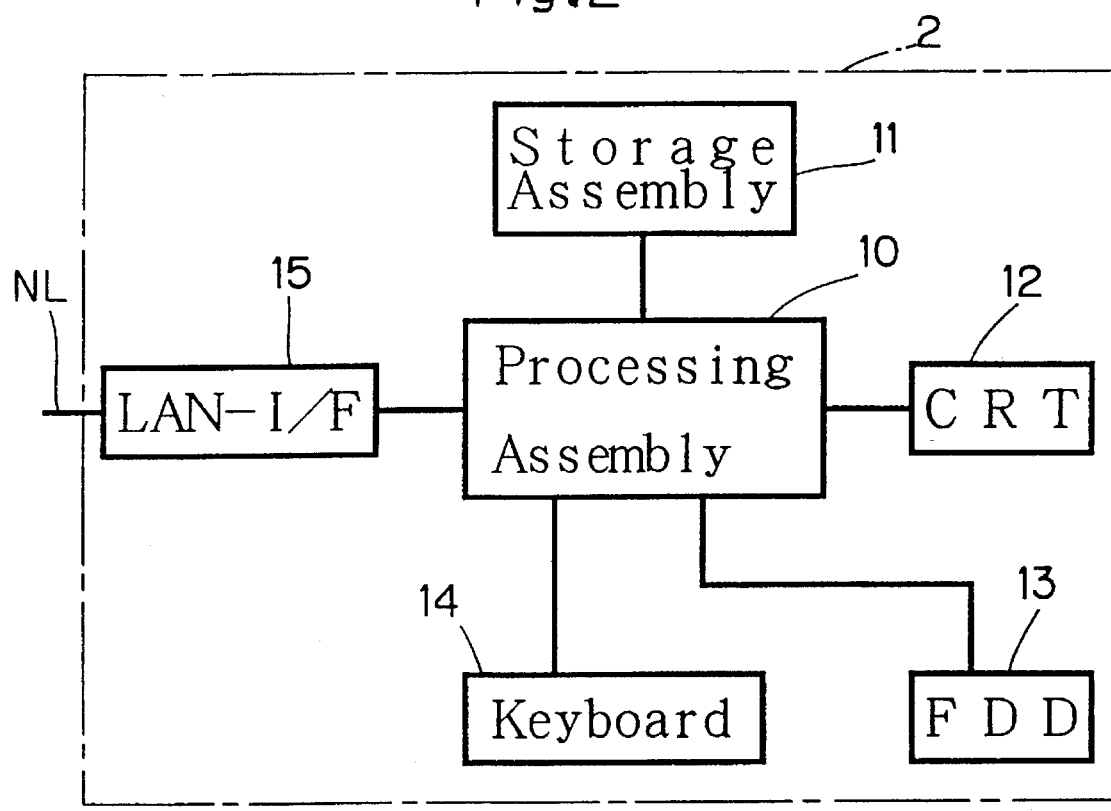
FIG. 2 is a block diagram of a page imposition layout device in accordance with one aspect of the present invention.

Page data layout device 2 has a process assembly 10 as shown in FIG. 2. Process assembly 10 contains a microcomputer consisting of a CPU, RAM and ROM. Storage assembly 11, CRT 12 (display assembly), flexible disk drive 13 and keyboard 14 are connected to process assembly 10. Further, external devices such as page data creation device 1, data conversion device 3 and exposure device 8 are connected to process assembly 10 via a local area network interface (LAN-I/F) 15 and network line NL.

Figure 3:
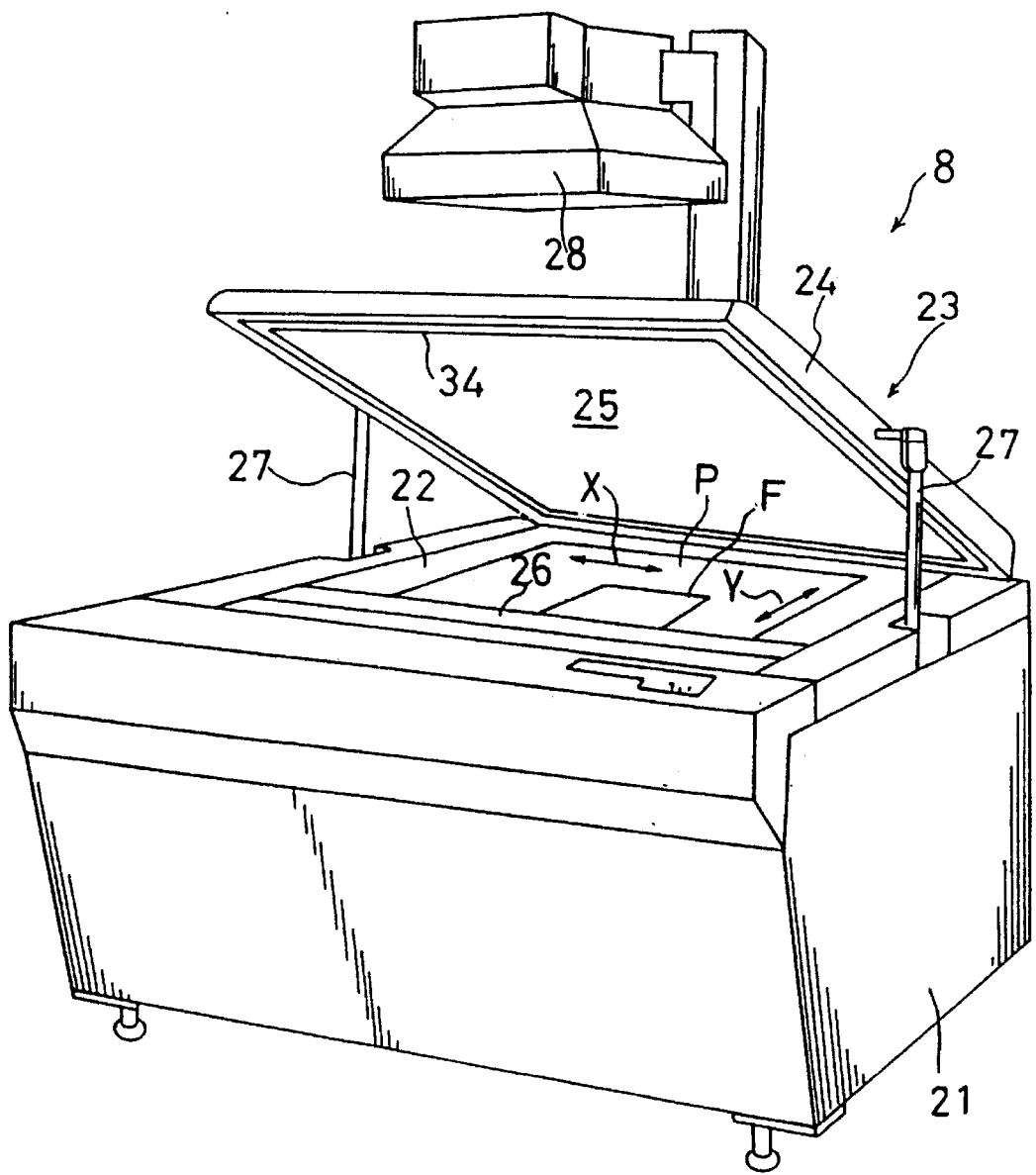
FIG. 3 is a perspective view of a belt type multiple exposure device in accordance with the present invention.

As shown in FIG. 3, exposure device 8 is a belt transport type multiple exposure device that positions the original film using an original transport belt. Exposure device 8 is equipped with device frame main unit 21, exposure table 22 that arranges a self-rising upper surface of device frame 21, upper frame 23 that makes it possible to open and close exposure table 22 and print light source 28 arranged at the upper side of upper frame 23. Upper frame 23 is equipped with frame 24 and transparent panel 25 arranged on the lower surface of frame 24. A mask device (FIG. 6) 33 is arranged on light transparent plate 25.

Figure 4:
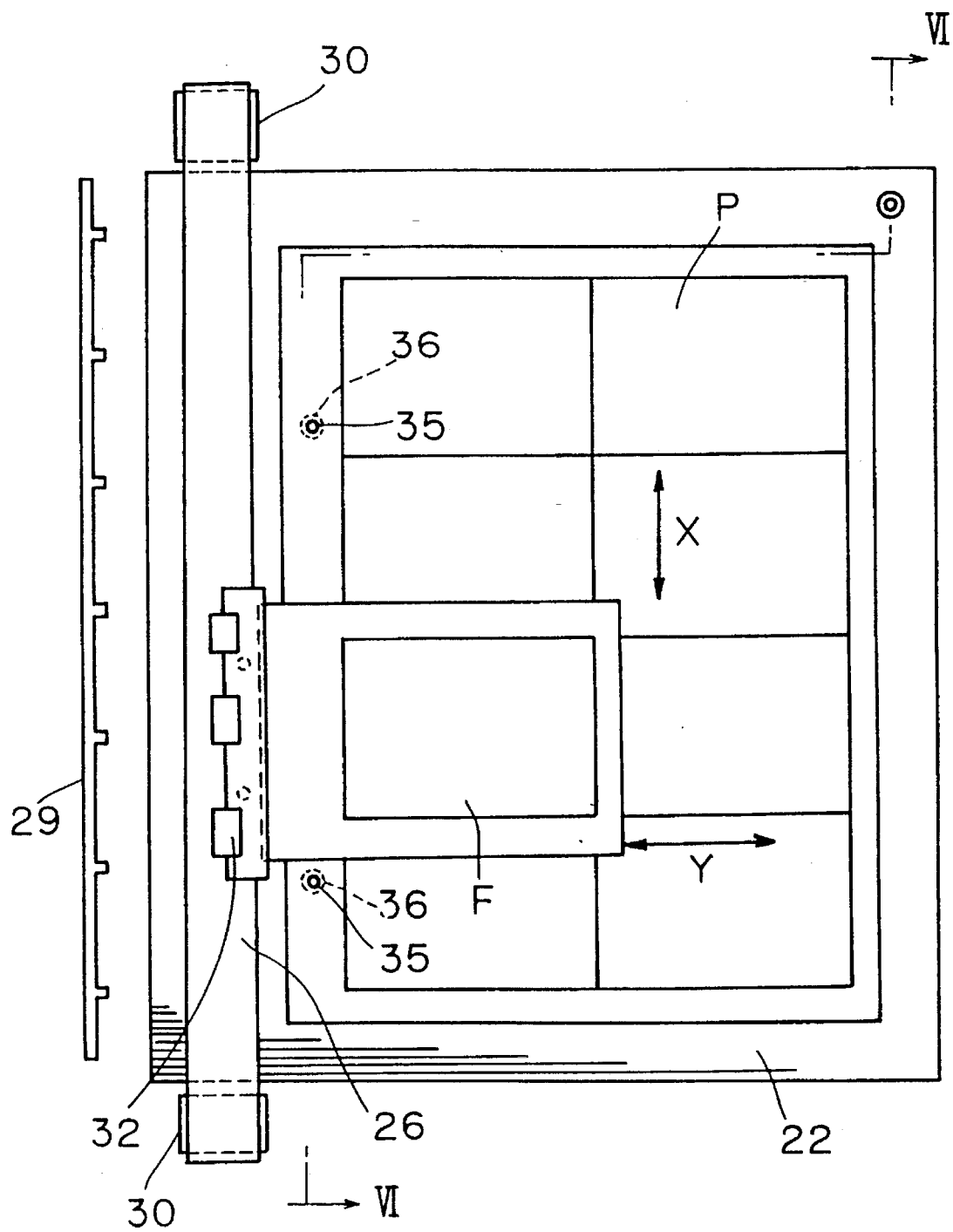
FIG. 4 a top view of a printing table of the exposure device depicted in FIG. 3.

As shown in FIG. 4, a pair of positioning pins 35 are provided to position printing plate P on exposure table 22. The pair of positioning pins 35 are each inserted in each bushing 36 that can be moved up and down. The pins are urged upward and out by springs not shown in the figure. Further, original transport belt 26, that can move up and down in the X- and Y-directions in relation to exposure table 22, is arranged on exposure table 22. With this original transport belt 26, it is possible to position and carry out multiple exposure printing on printing plate P of a PS plate installed on a position on exposing table 22 while successively exchanging original film F that is smaller than printing plate P. Further, original transport belt 26 can also be used to position original film of a page data from among a group of page data that was initially not complete. Original transport belt 26 is wrapped on one pair of pulleys 30 horizontally arranged on exposure table 22 and setup to enclose exposure table 22.

Figure 5:
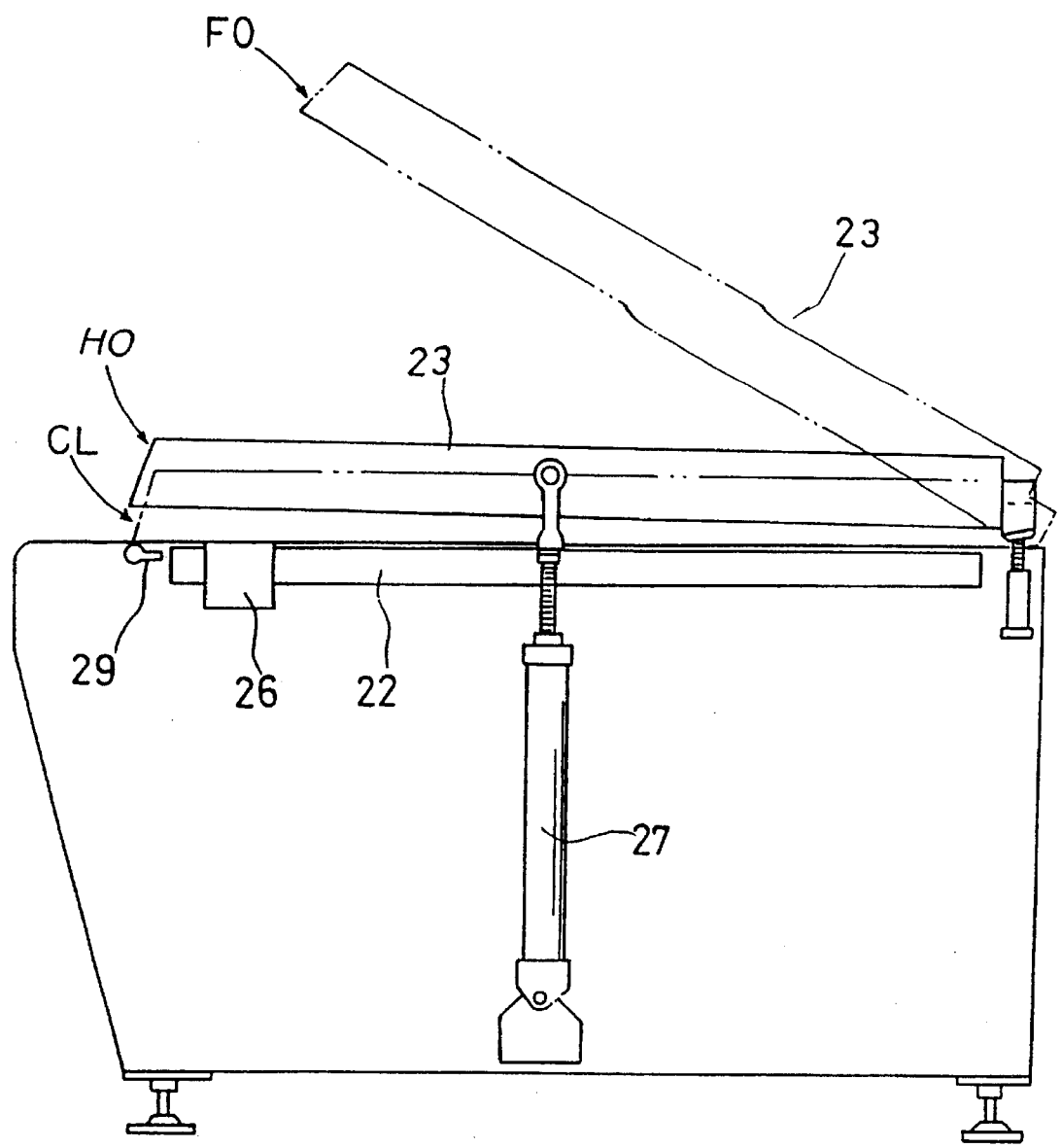
FIG. 5 is a side view of the exposure device depicted in FIG. 3.

As shown in FIGS. 3 and 5, upper frame 23 can be opened and closed using air cylinder 27 which is setup at both sides of the frame. This allows changeovers between the full-open (FO), half-open (HO) and closed (CL) positions. In the full-open (FO) position, printing plate P and original film F are manually replaced by the operator. In the half-open (HO) position, the original transport belt 26 operates to transfer original film F in the X- and Y-directions and transfer the original film to the prescribed position. Further, in the closed (CL) position, original film F and printing plate P make contact and print.

As shown in FIG. 4, the front side (left side in drawing) of original film F is held in place at original transport belt 26 by adhesive tape and positioned in the X- and Y- directions in relation to printing plate positioned on exposure table 22. At this time, exposure table 22 is slightly lowered forming a space to allow relative movement between original transport belt 26 and printing plate P. Air is flows through this space from air nozzle 29 arranged in front of exposure table 22 to prevent the rear edge of original film F from hanging down and touching printing plate P.

Figure 6:
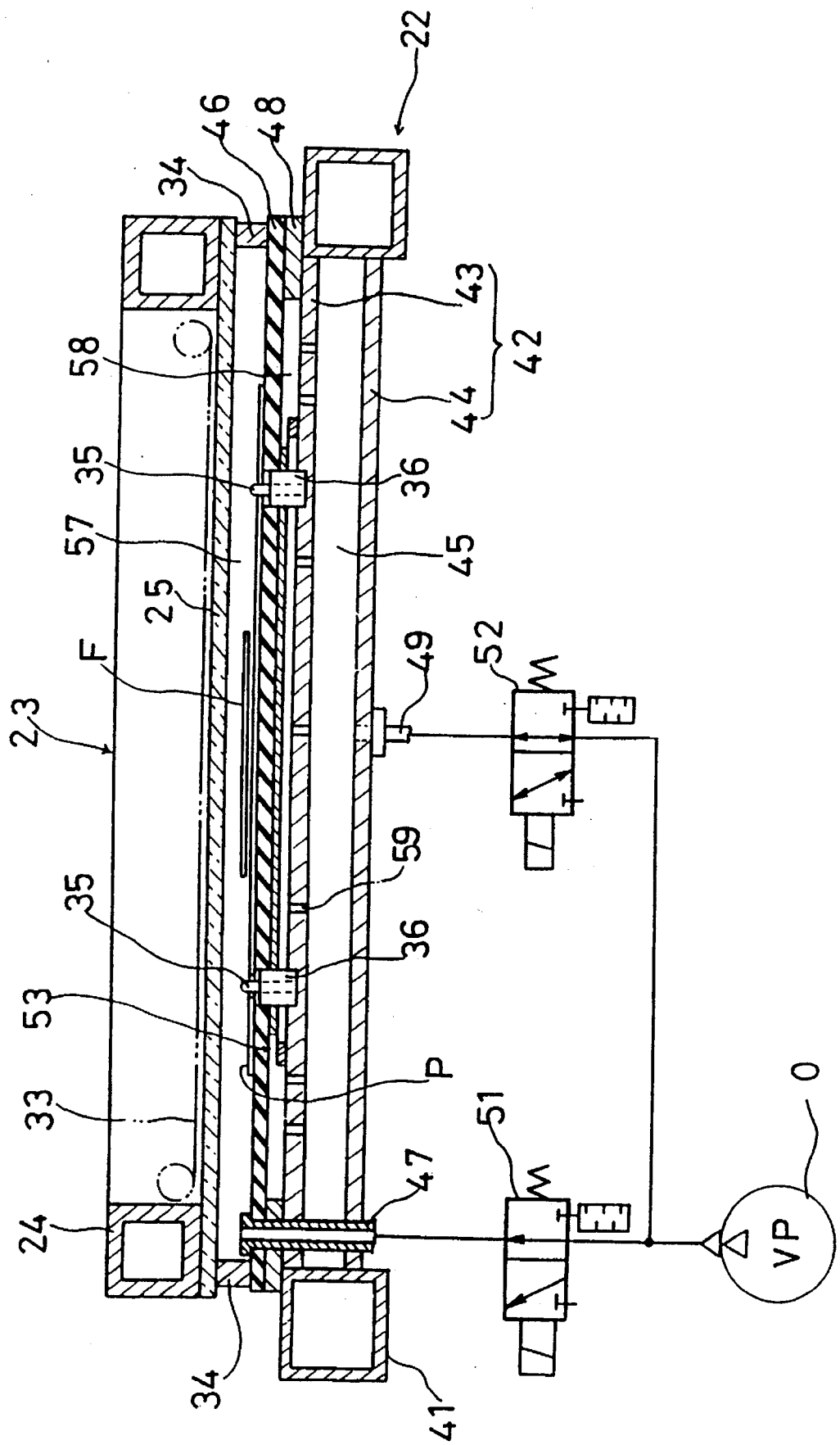
FIG. 6 is a partial cross-sectional view taken along the lines VI—VI of FIG. 4.

As shown in FIG. 6, exposure table 22 is mainly composed of frame 41 and sheet support plate 42 fixed inside frame 41, and elastic sheet 46 which is only fixed around sheet support plate 42 by double-sided adhesive tape. Sheet support plate 42 is mainly composed of front plate 43 and rear plate 44 with empty airspace 45 between front plate 43 and rear plate 44. Airtight seal 34 is arranged around transparent panel 25. Airtight seal 34 obtains an airtight seal for the exposure compartment formed between transparent panel 25 and elastic sheet 46. An exposure compartment 57 is connected to vacuum pump 50 via air exhaust outlet 47 and electromagnetic valve 51. When valve 51 is connects the air exhaust outlet 47 and vacuum pump 50, the atmosphere is evacuated from the compartment. Further, Backup exhaust compartment 58 is connected to vacuum pump 50 via airspace 45, air exhaust outlet 49 and electromagnetic valve 52. When valve 52 is connects air exhaust outlet 49 and vacuum pump 50, the atmosphere is evacuated from the compartment.

Figure 7:
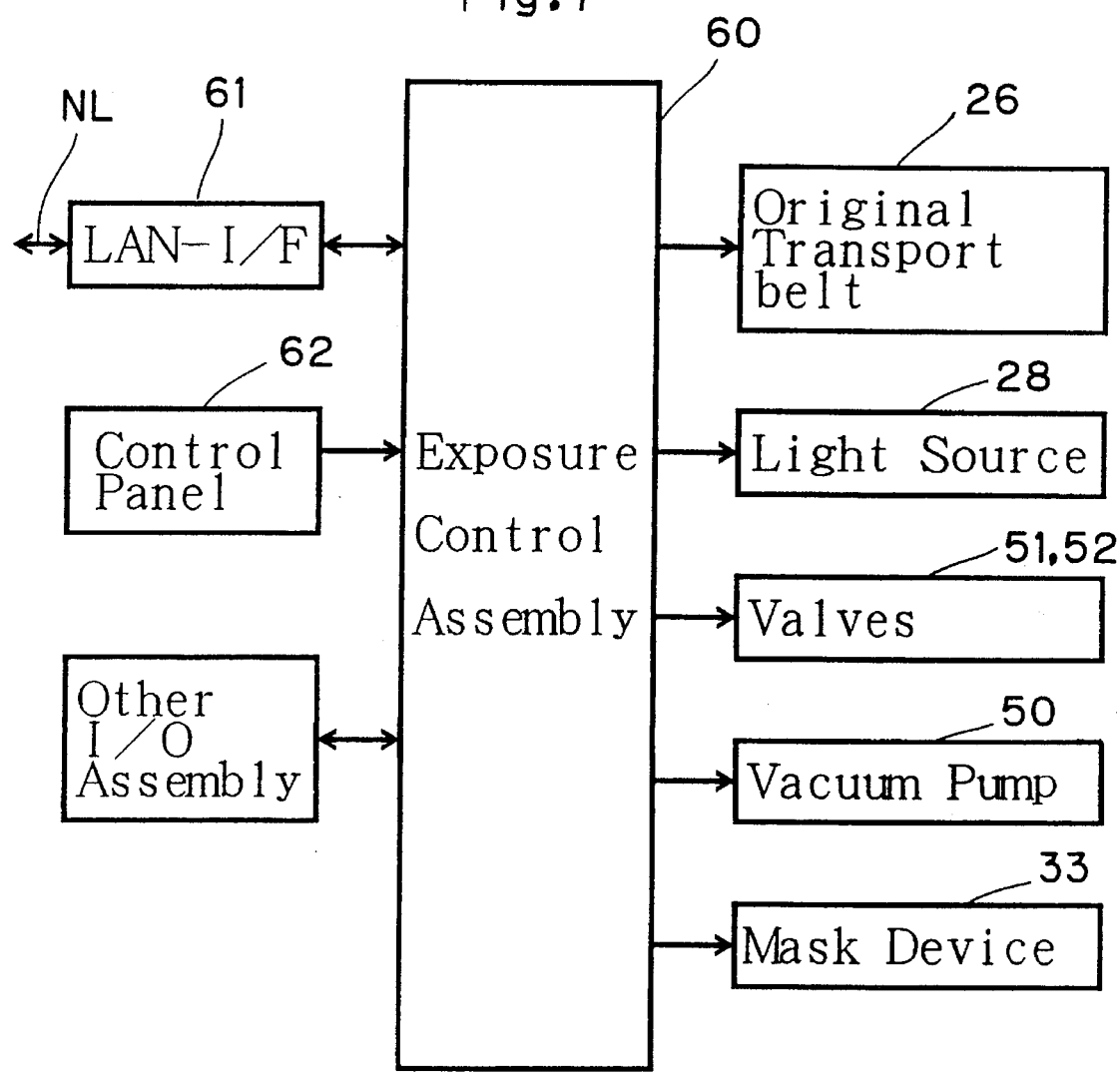
FIG. 7 is a block diagram representing a control unit of exposure device depicted in FIG. 3.

Exposure device 8 has an exposure control assembly 60 as shown in FIG. 7. Exposure control assembly 60 contains a microcomputer consisting of a CPU, RAM and ROM (not shown). Original transport belt 26, light source 28, valves 51 and 52, vacuum pump 50 and mask device 33 are all connected to print control assembly 60. Further, local area network interface (LAN-I/F) 61 which is connected to network line NL, control panel 62 and other I/O assemblies are connected to print control assembly 60.

Next, the operation of the platemaking system configured like this will be explained.

At first, the control and operation of page data layout device 2 of process assembly 10 will be explained by the control flowcharts in FIGS. 8 thru 10. In the example, an original film will be provided with 8 pages of information for a configuration where 16 pages of information will be printed on the front and rear of one sheet of paper 70. Hence, two original films will be required, one film for each side of the paper. However, only one film will be discussed.

Figure 12:
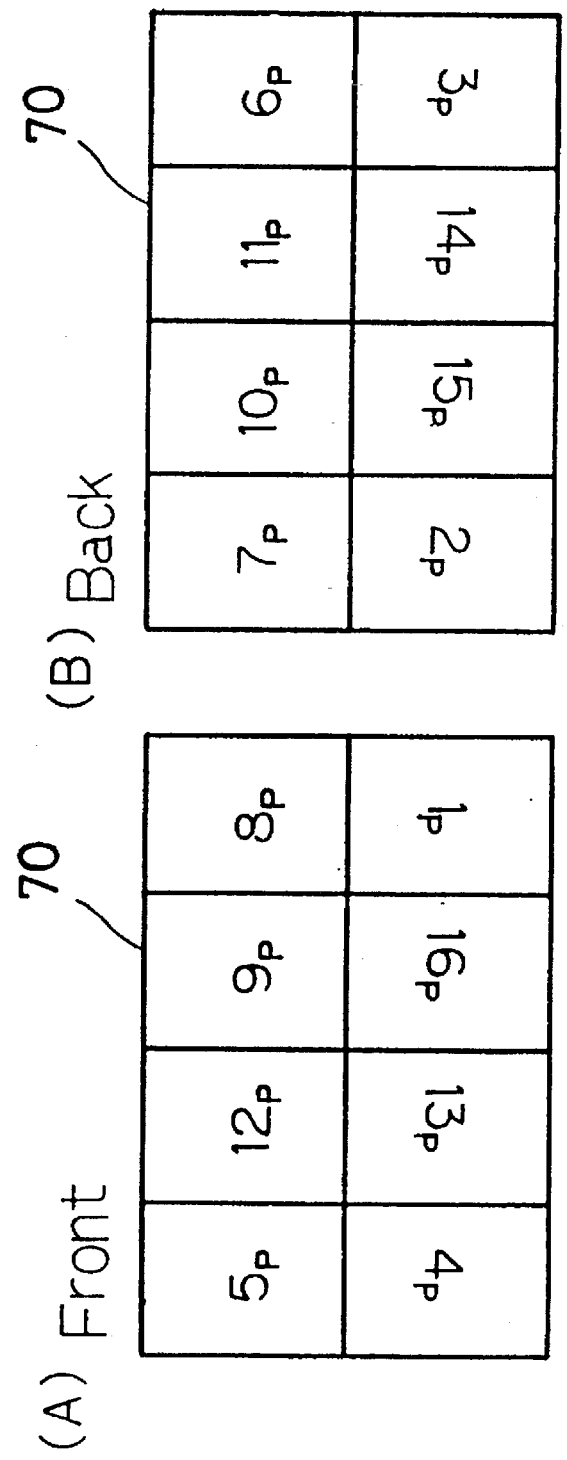
FIG. 12 is a plan view of showing one example of a page data layout showing the relationship of a plurality of page data arranged on each side of a single piece of paper.

In FIG. 12, two sides of a single sheet of paper 70 are shown. The numeric values shown represent sequential the page numbers in the relationship required for producing a sixteen page block of printed matter. Two sides of a single piece of paper are represented in FIG. 12. The direction of the page numbers indicate the top and bottom direction of the associated page number. In this example, the top and bottom direction of information for pages 5 to 12 are opposite that of the information for pages 1 to 4 and 13 to 16.

Figure 8:
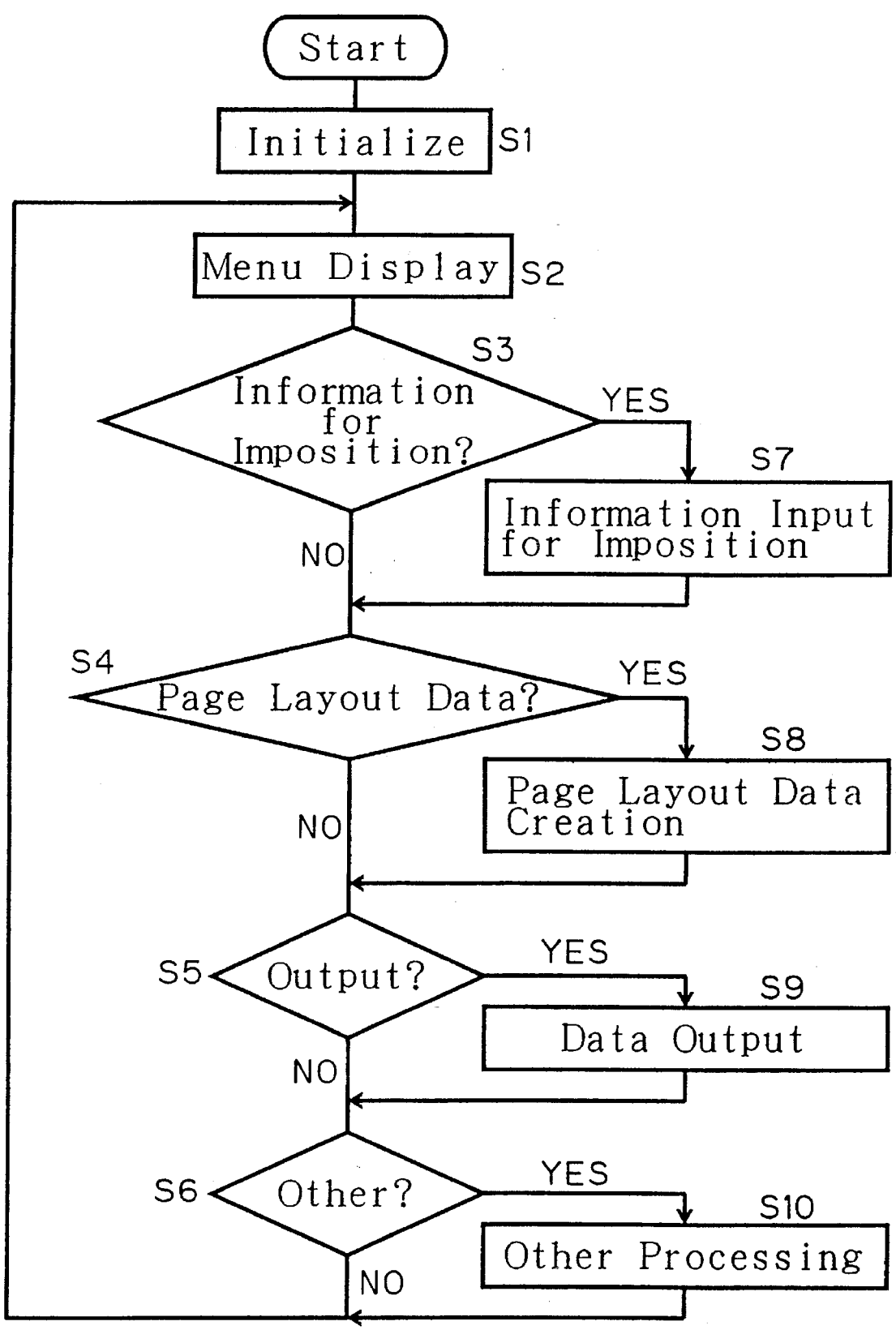
FIG. 8 is a flowchart representing the steps effected by the control unit depicted in FIG. 7.
Figure 9:
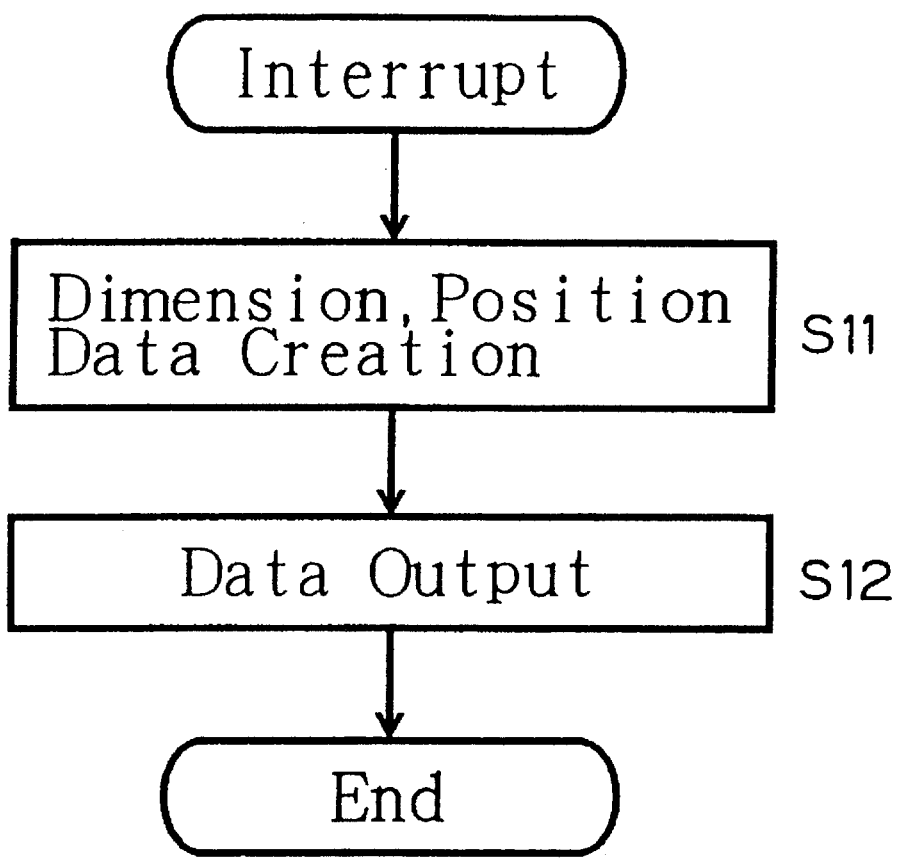
FIG. 9 is flowchart representing the interrupt processing steps of the control unit depicted in FIG. 7.

When the device starts, the initial settings in step S1 of FIG. 8 are initialized. These initial settings set the page number of each assigned position of the original film (described later)to [0] and set all the top and bottom directions to the top direction. Page number [m] is further set to [1]. A process menu for step S2 will display on the CRT 12. Various types of process menus display on the CRT allowing a user to choose various parameters, such as the number of pages, orientation of the pages, etc. In step S3 determination is made as to whether or not the menu that indicates information for imposing was selected from among the menus. The imposing information here is information concerning, for instance, page size, number of folds, right opening or left opening book, hinged at the top or bottom, how the pages are to be bound and cut, the type of gutter necessary, additional dimensions, registration marks and page numbers.

In step S4 a determination is made as to whether or not the process menu to create page layout data was selected. Next, in step S5 a determination is make whether or not the process menu to output imposition data was selected. Finally, in step S6 a determination is make whether or not other process menus were selected. If the process menu that indicates information for imposing was selected, then the process moves from step S3 to step S7. In step S7, information to carry out imposing indicated by the operator is incorporated.

Here the example as shown in FIG. 12 to create printing paper will indicate information for "8 folds and a right opening book". Further, if the process menu to create page layout data was selected, move from step S4 to step S8. In step S8, the page layout data creation process (described later) is carried out. Further, if the process menu to output imposition data was selected, the process moves from step S5 to step S9. In step S9, page data of each page created by page data creation device 1 create imposition data that is laid out based on page layout data created in step S8. The imposition data is then outputted to data conversion device 3 via network line NL.

In the data output process a bitmap memory corresponding to the size of the original film in advance is prepared inside memory assembly 11 for page data layout device 2 and a page data is laid out in this bitmap memory in accordance with page layout data. When all the layouts are complete, data in the bitmap memory is read and outputted to the data conversion device 3 as imposition data. Further, multiple sizes split on original film and multiple data split in bitmap memory can be output to data conversion device 3. Imposition data is outputted for the original film that was set in output device 4 at the assigned position and direction shown in FIG. 12 based on this information in data conversion device 3.

If a menu is selected to carry out another process, the process moves from step S6 to step S10 and carry out the corresponding process. Further, within the menu display, if exposure device 8 issues an output request for dimensions and positions contained in the page data and page layout data, the interrupt process shown in FIG. 9 will execute. At this point, the dimension and position data that indicates the size of the dummy page data (described later) and position on the original film from the page data and page layout data in step S11 will be created. In step S12, this created dimension and position data is outputted to the exposure device 8 via network line NL.

Figure 10:
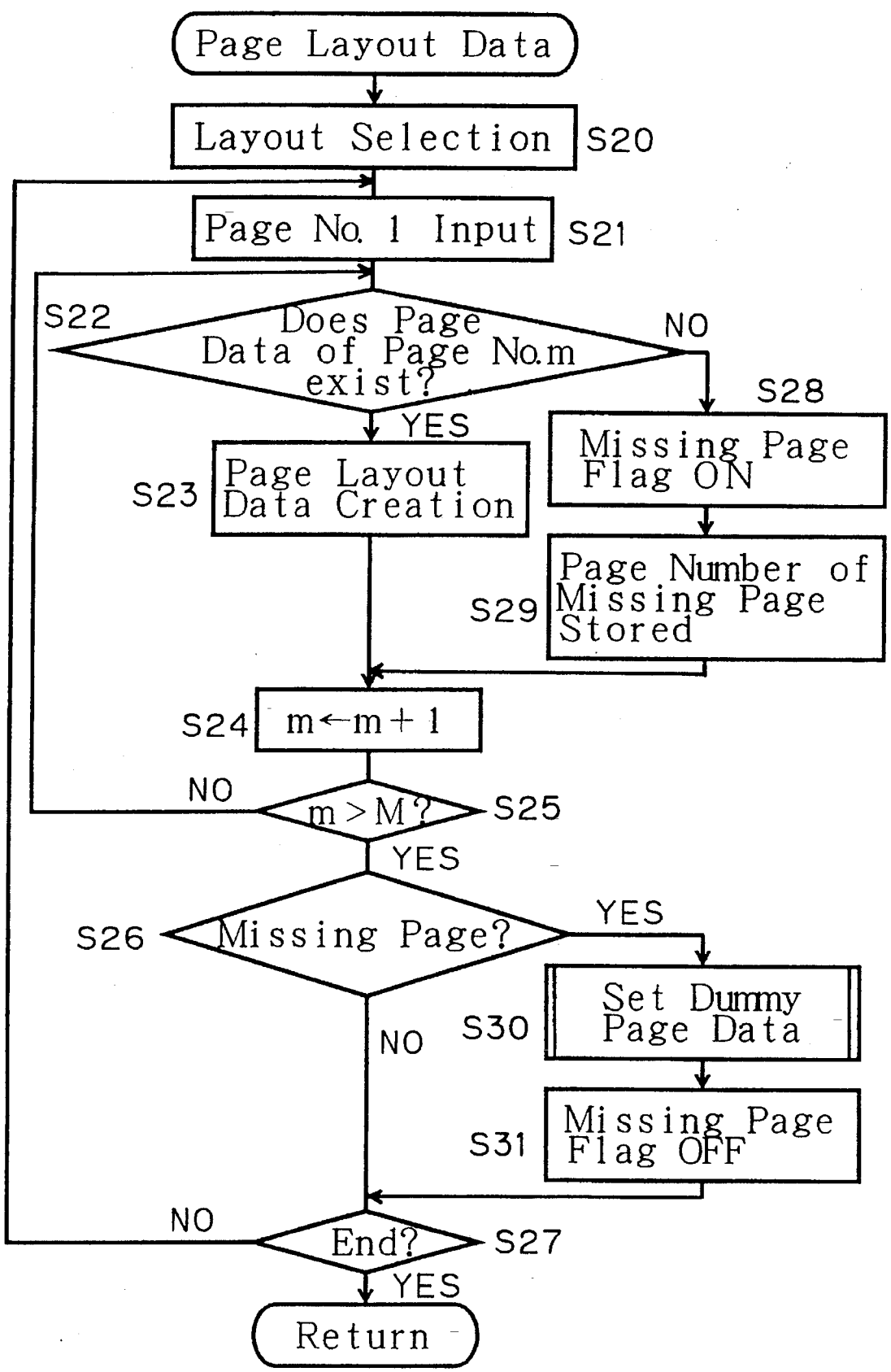
FIG. 10 is a flowchart representing a page layout data creation process effected by the control unit depicted in FIG. 7.

When the page layout data creation process of step S8 in FIG. 8 is selected, the process moves to the layout for the page data in step S20 of FIG. 10. At this point, the layout includes the layout position of each page data and the page data sequence, for instance 5, 12, 9, 8 . . . as on the left hand side of a portion of FIG. 12. In step S21, the first page number of the page data is input and that input number converted to [m].

In the example shown in FIG. 12, in order to create imposition data in 16 page units, the first page number is input every unit with a judgement made on page number m that will be laid out. For example, in a imposition configuration where groups of 16 page are to be printed, page numbers, 1, 17, 33, 49 - - - are considered as the first page of each respective group. When 17 is inputted, the layout of each page data as one unit from page 17 to page 32 can be done for the imposition data that will be created. Further, in step S20, if a first page number that does not conform to the selected layout is inputted, an error occurs.

Next, in step S22, a judgement is made on whether or not page data of page number m is prepared. When the page data is prepared, the operation flow moves to step S23 and in accordance with the layout selected in step S20, page layout data is created after which the operation flow moves to step S24. In contrast to this, if the page data is not prepared in step S22 when the judgement is made, the missing page flag that indicates missing page data will turn on in S28. In step S29, the page number of the missing page data and layout position of the page data are stored and the operation flow moves to step S24. In step S24, number m increments to indicate the page number.

Next, in step S25, a judgement is made on whether or not the page number exceeded a prescribed value M. At this point, prescribed value M represents page number m+15 as in the example shown in FIG. 12 and a judgement is made on whether or not the process for the 16 page unit completed. If the value was not exceeded, processes on and after step S22 will execute again. If the value was exceeded, the process will move from step S25 to step S26 and a judgement will be made on whether or not a page is missing. If no page is missing, the process will move to step S27 and a judgement will be made on whether or not the key to end the process was pressed. If the key was not pressed, the operation flow will return to step S21 and the page layout data creation process will execute identical to the above.

Conversely, in step S26 when it is judged that a page is missing, the dummy page data set process (described later) will execute in step S30. When the dummy page data set process completes, the missing page flag in step S31 turns off and the operation flow moves to step S27.

Figure 11:
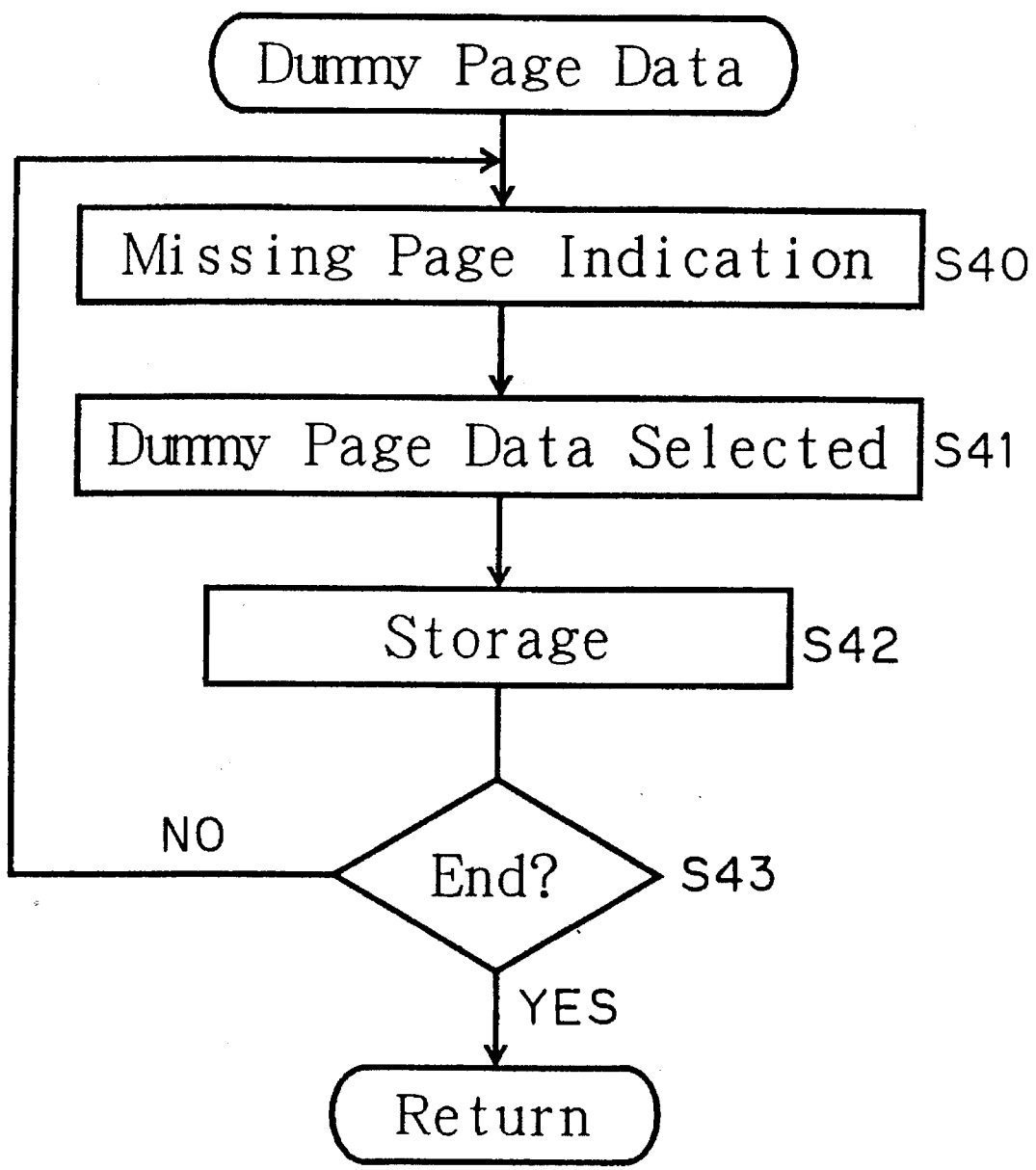
FIG. 11 is a flowchart representing steps of a dummy page data set process effected the control unit depicted in FIG. 7.

In the dummy page data set process of step S30, the missing page in step S40 of FIG. 11 displays in CRT 12. It is here where the missing page number will be displayed. In step S41, each type of dummy page data such as data for shading mask creation is selected by an indication from the operator. These dummy page data are created beforehand and stored in page data creation device 1 or page data layout device 2. Next, in step S42, the selected dummy page data is stored as a page data that will layout the missing page. Further, in step S43, a judgement is made on whether or not the set processing for all the missing page dummy page data completed. If the processing is not complete, processes on and after step S40 will execute again.

Figure 13:
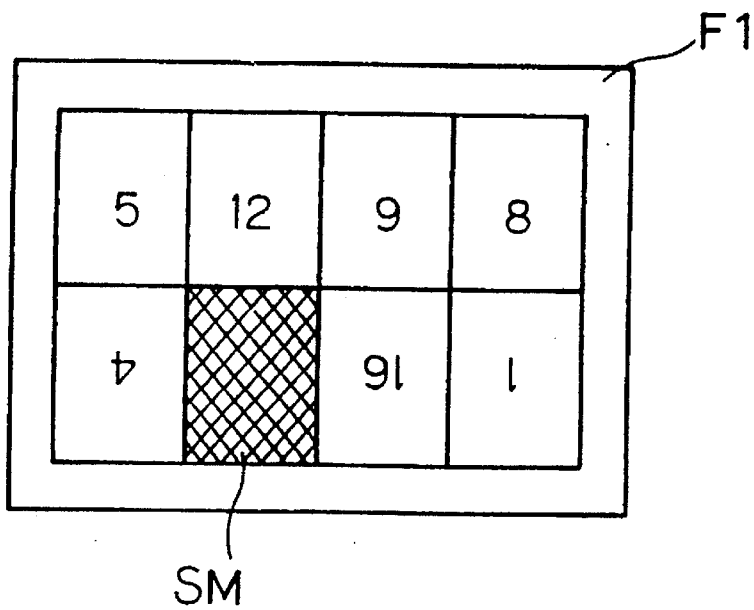
FIG. 13 is a plan view showing one example of an original film having one page or section masked.

In step S41, when data for shading mask creation is selected as dummy page data, black data is created. In step S42, this created black data is stored as a page data to be laid out at the corresponding assigned position. FIG. 13 shows original film F1 created by using this type of dummy page data. For this case, shading mask SM will be created at the assigned position of page 13.

Figure 14:
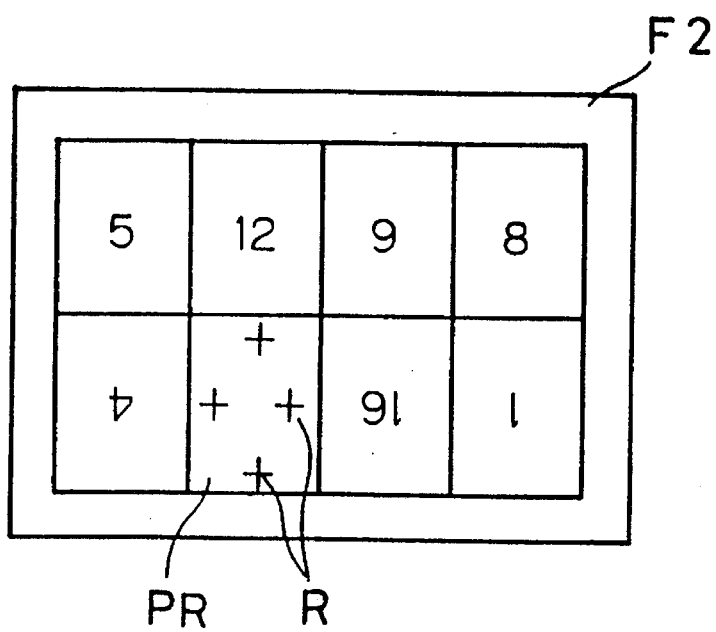
FIG. 14 is a plan view showing another example of an original film having one page or section marked for later page insertion.

Further, in step S41, when data for transparent region creation is selected as dummy page data, a register mask for registration generates and a register mask records on the applicable page. For this case, blank data (transparent region) and register mask R are recorded and original film F1 created as shown in FIG. 14. At this point the assigned position of page 13 becomes transparent region PR and a register mask is recorded at this area.

Figure 15:
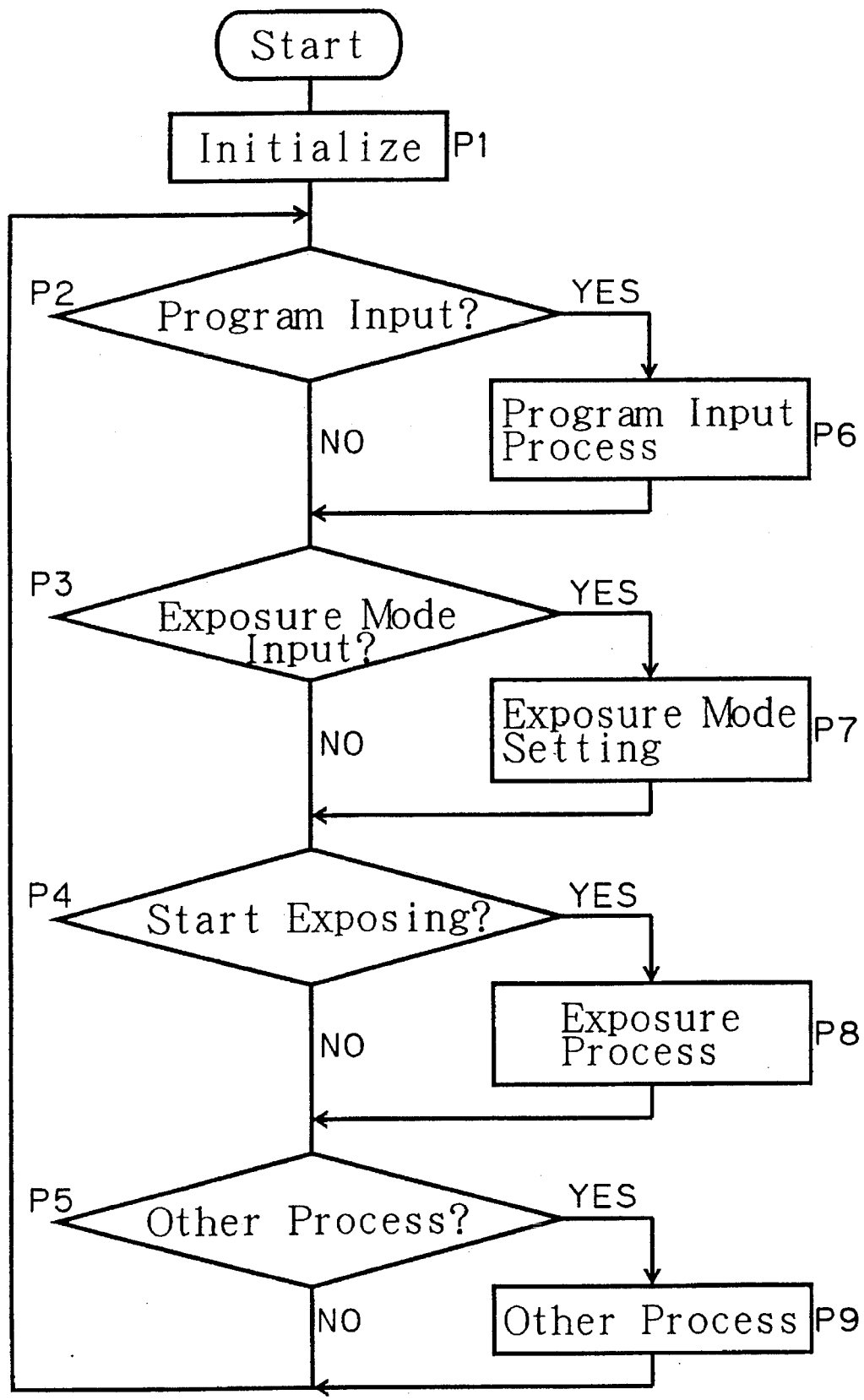
FIG. 15 is a flowchart representing the steps of a print control process of the present invention.

Next, control and operation of exposure control assembly 60 will be explained using the control flowcharts shown in FIGS. 15 to 17. In exposure control assembly 60 resetting each flag and initial setting process for zero point return of original transport belt 6 are done as shown in step P1 of FIG. 15. In step P2, a judgement is made on whether or not the exposure program was input by the operator. In step P3, a judgement is made on whether or not an input for exposure mode was made. In step P4, a judgement is made on whether or not a command was issued to start exposing by the operator. Further, the operator should set the original film and printing plate on exposure table 22 of exposure device 8 before issuing the start exposure command. In step P5, a judgement is made on whether or not a command was issued for other processes. If there is a judgement that no command for other processes was issued, the operation flow returns to step P2.

If there is a judgement that file exposure program was input, the operation flow moves from step P2 to step P6. In step P6, the exposure program input process is carried out. In the exposure program input process, the following information is stored: information concerning the position and size for the original film size and movement position of the original film; information concerning the number of surfaces such as repetition frequency; information concerning exposure and vacuum seal for the exposure time and seal time; other input information such as replacement instructions of the original film and exposure order; and each exposure program file that was input.

If there is a judgement that an input for exposure mode was made, the operation flow moves from step P3 to step P7. In step P7, the print mode setting process (described later) is carried out. If there is a judgement that a command was issued to start exposing was issued, the operation flow moves from step P4 to step P8 and the exposure process (described later) executes. If there is a judgement that a command for other processes was issued, the operation flow moves from step P5 to step P9 and the commanded process executes.

Figure 16:
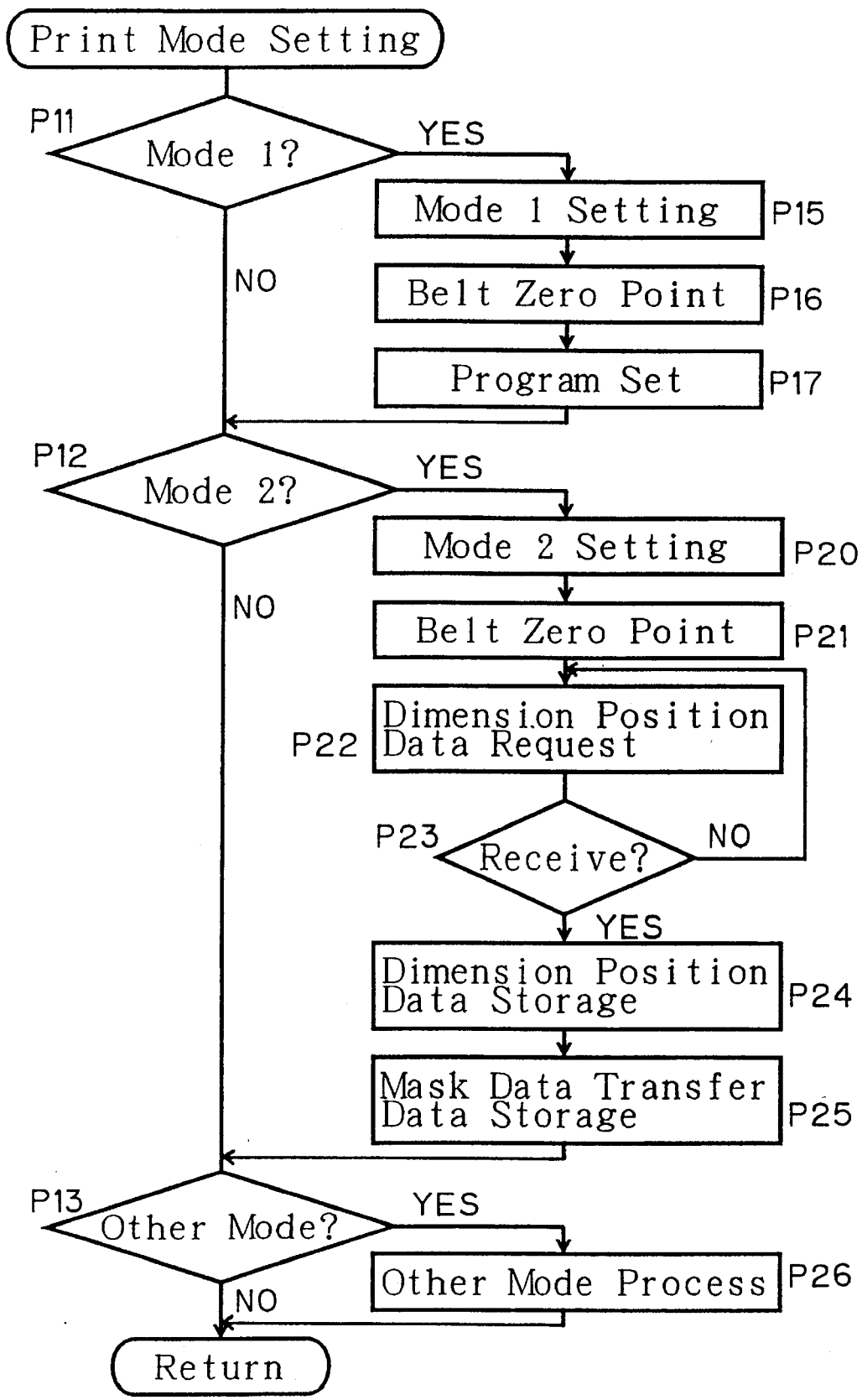
FIG. 16 is a flowchart representing a exposure mode setting process effected during the print control process.
Figure 17:
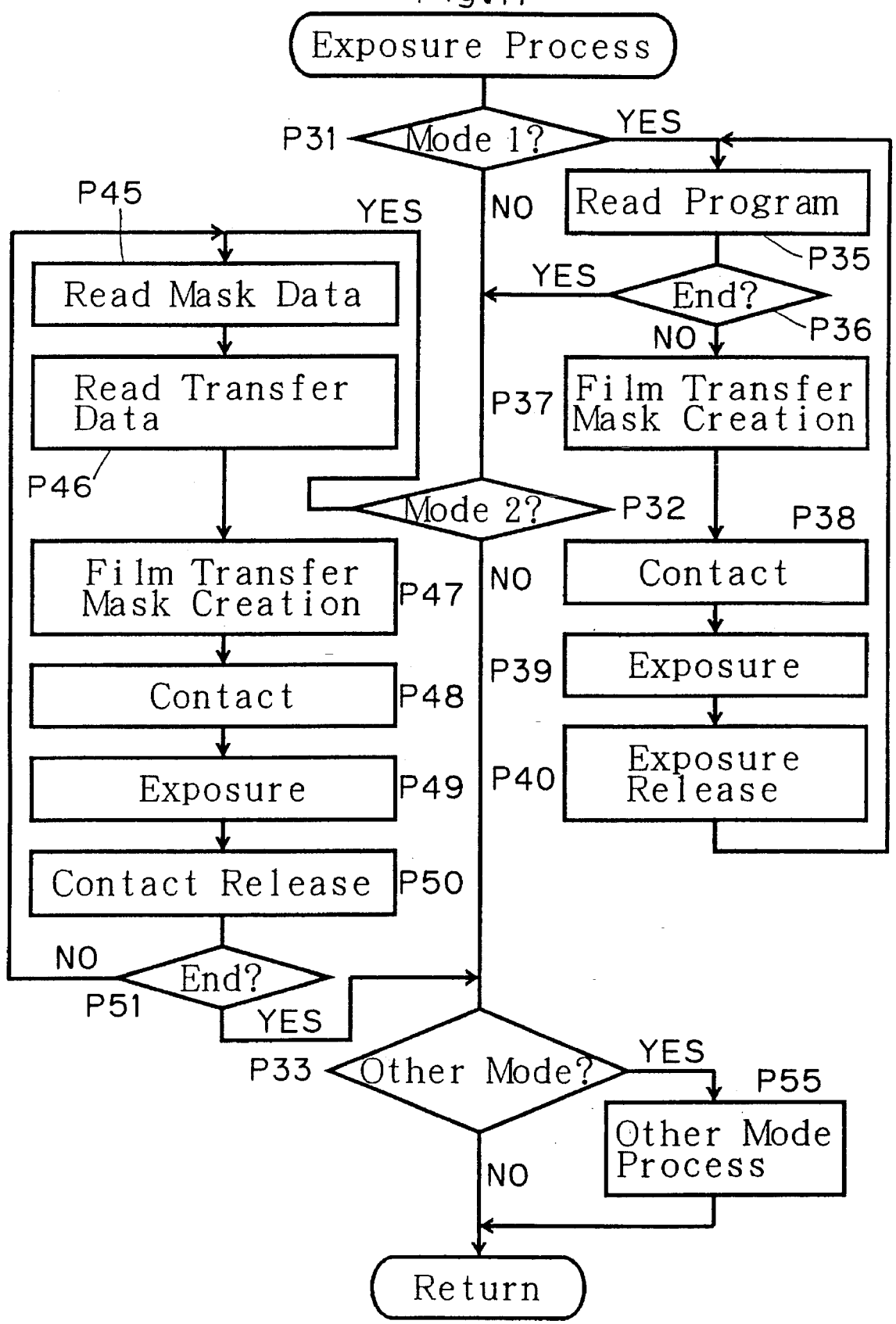
FIG. 17 is a flowchart representing an exposure process effected during the exposure control process.

In the exposure mode setting process of step P7, a judgement is made on whether or not exposure mode 1 was specified as the exposure mode in step P11 of FIG. 16. Mode 1 is defined as a mode to carry out exposure processing in accordance with an input exposure program. In step P12, a judgement is made on whether or not exposure mode 1 was specified as the exposure mode. Mode 2 is defined as a mode to carry out the exposure process where dummy page data is laid out instead of prepared page data. In step P13, a judgement is made on whether or not another mode was specified.

If there is a judgement that mode 1 was specified, the operation flow moves from step P11 to step P15. In step P15, the exposure mode is set to mode 1. In step P16, original transport belt 26 is returned to the zero point. In step P17, the desired exposure program is selected from the previously stored exposure programs and set. If there is a judgement that mode 2 was specified, the operation flow moves from step P12 to step P20. In step P20, the exposure mode is set to mode 2. In step P21, original transport belt 26 is returned to the zero point. In step 22, an output request for dimension and position data of dummy page data is sent to page data layout device 2.

When the dummy page data is assigned multiple locations at this point and the output request is sent, the requested locations are specified, for example, by designating page numbers. In step P23, the process waits for the receive of the dimension and position data from page data layout device 2. When the dimension and position data are received, the operation flow moves to step P24 and the received dimension and position data is stored. In step P25, the mask data that determines the mask region and position as well as movement data that moves the original film to the prescribed position are determined from the stored dimension and position data with that result stored.

If there is a judgement that another mode was specified, the operation flow moves from step P13 to step P26. In step P26, the process of the other mode executes. In the exposure process in step P31 of FIG. 17, a judgement is made on whether or not the exposure mode is set to mode 1. In step P32, a judgement is made on whether or not the exposure mode is set to mode 2. In step P33, a judgement is made on whether or not the exposure mode is set to another mode.

If there is a judgement that the exposure mode is set to mode 1, the operation flow moves from step P31 to step P35. In step 35, the set exposure programs are read one at a time. In step 36, a judgement is made on whether or not the exposure program completed. If the exposure program completed, the operation flow moves to step P32. If the exposure program is not complete, the operation flow moves to step P37. In step P37, the original film is moved by original transport belt 26 in accordance with the read exposure program. Further, a mask is created by the mask device 33.

In the next step P38, vacuum pump 55 and valves 51 and 52 are operated to contact seal the original film and printing plate. At this point, vacuum pump 50 starts operation and valves 51, 52 switch to a position so exhaust openings 47, 49 can connect to vacuum pump 50 then, the air from exposure compartment 57 and reserve exhaust compartment 58 is exhausted. When this occurs, elastic sheet 46 adheres to sheet support plate 42. In contrast to this, the air pressure in exposure compartment 57 located between transparent plate 25 and elastic sheet 46 exhausts to lower the pressure. Then, when the vacuum pressure in exposure compartment 57 reaches approximately 400 mm Hg, valve 52 switches to the side to let air pass. By this action, elastic sheet 46 is successively pushed up by the air pressure from file center area outward and original film F and printing plate P contact from the center. In this state, after the prescribed time expires, printing plate P will be in contact to transparent plate 25 due to the vacuum.

In step P39, light source 28 lights and the exposure process executes. When the exposure process completes, in step 40, valve 51 switches to the side open to the atmosphere opening exposure compartment 57 to the atmosphere to release the vacuum contact. Together with this, valve 52 switches to the vacuum pump 50 side to exhaust airspace 45 and 58. This action re-contacts the elastic sheet 46 to the support plate 42.

Figure 20:
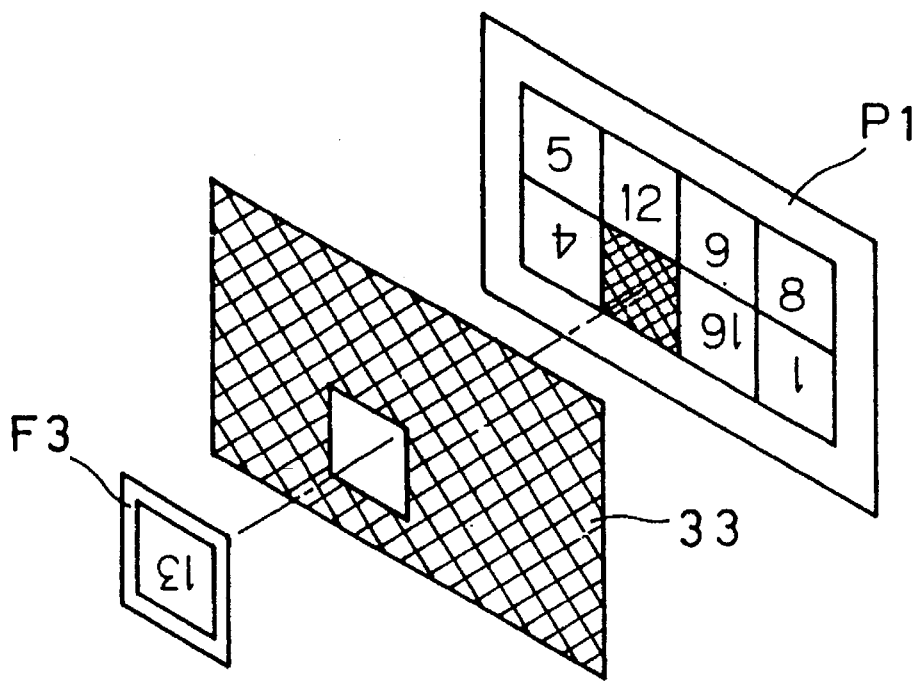
FIG. 20 is a perspective view showing a superimpose exposure process using one method of the present invention.

When these processes complete, the operation flow returns to step P35 and the next exposure program is read. If there is a judgement that mode 2 is set, the operation flow moves from step P32 to step P45. In step P45, mask data is read. Further, in step P46, movement data is read. In step P47, original film F is moved by original transport belt 26 and a mask is created by the mask device 33. By this action, mask 33 is created as shown in FIG. 20. Further, before the exposure process starts, original film F3 that includes the images corresponding to the data of page 13 is attached to original transport belt 26 in advance. This original film F3 moves to the position of page 13.

In step P48, the vacuum contact process executes identical to step P38. As a result, original film F3 and the printing plate P contact one another. In step P49, the exposure process executes identical to step P39. In step P50, the contact release process executes identical to step P40. In step P51, a judgement is made on whether or not the dummy page data process is complete. This judgement judges whether or not there is any subsequent dummy page data. If there is a judgement that dummy page data still exists at that time, the operation flow moves to step P45. Also, if there is a judgement that no dummy page data exists at that time, the operation flow moves to step P33. Further, if multiple pages of dummy page data exists, while original film F3 is being attached, only the page numbers need be input and the mask data of the page numbers and movement data which were input in steps P45 and P46 read. In step P33, if there is a judgement that another mode process is set, the operation low moves to step P55 and the other mode executes.

Figure 18:
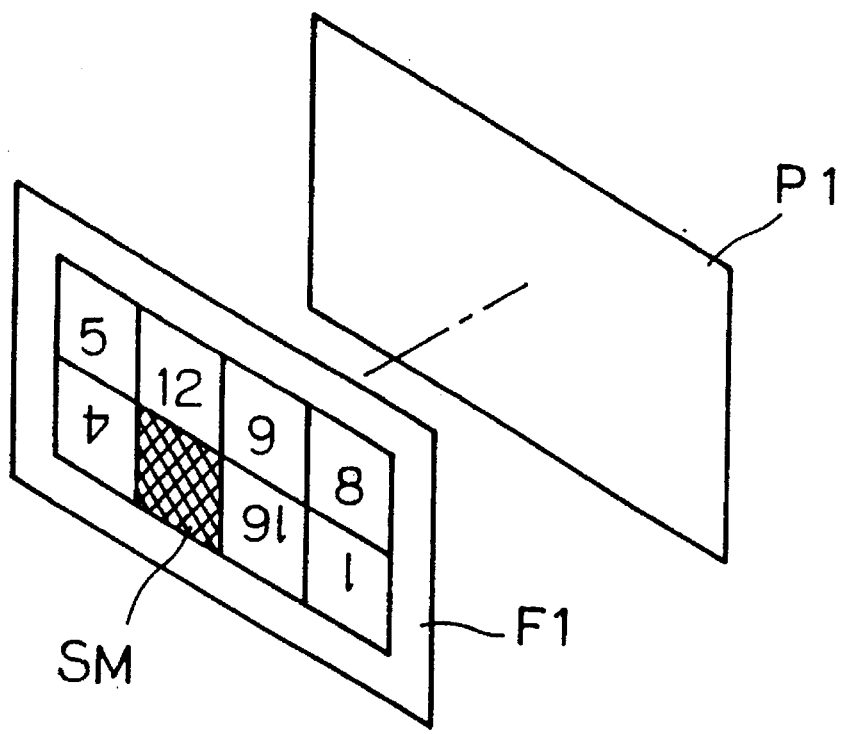
FIG. 18 is a perspective view of an original film and a printing plate created during the exposure process.
Figure 19:
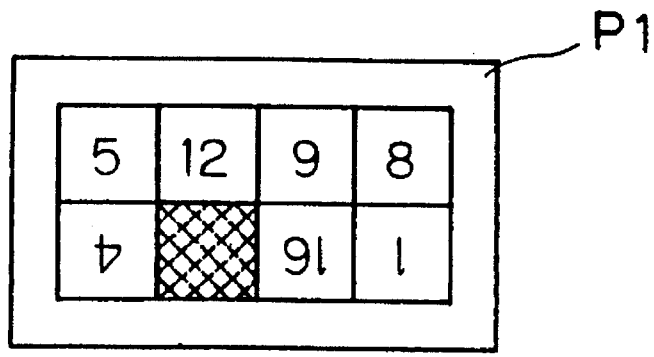
FIG. 19 is a plane view of the printing plate depicted in FIG. 18, created during the exposure process but with one portion left undeveloped.

For instance, if only the 13th page data is not complete, as shown in FIG. 18, original film F1 will be created by output device 4. That is, original film F1 will be created with a shaded 13th page region. Also, the created original film F1 and printing plate P will be exposed by exposure processing of mode 1. As a result, as shown in FIG. 19, an undeveloped printing plate P1 is created. Only the assigned position of the 13th page is unexposed here.

Continuing, the exposure process executes by mode 2. For this case, mask 33 is created using the mask data that was created based on the dimension and position data of the 13th page from the page data layout device 2 as shown in FIG. 20. Further, if, for example, original film F3, such as an advertisement prepared independently for the 13th page is set to original transport belt 26, the film F3 is moved to the position of the 13th page by the movement data that was created based on the dimension and position data from page data layout device 2 identical to the explanation above.

Figure 21:
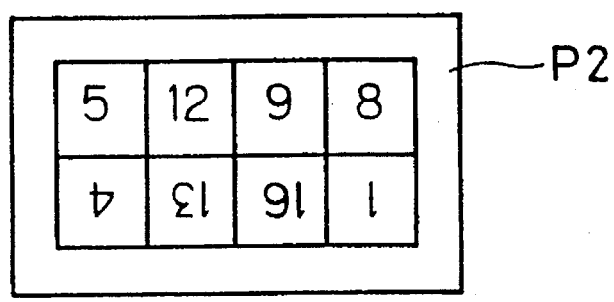
FIG. 21 is a plane view showing a printing plate created by method depicted in FIG. 20.

Printing plate P and original film F3 then contact and the exposure process executes. As a result, printing plate P2 is obtained as shown in FIG. 21.

Figure 22:
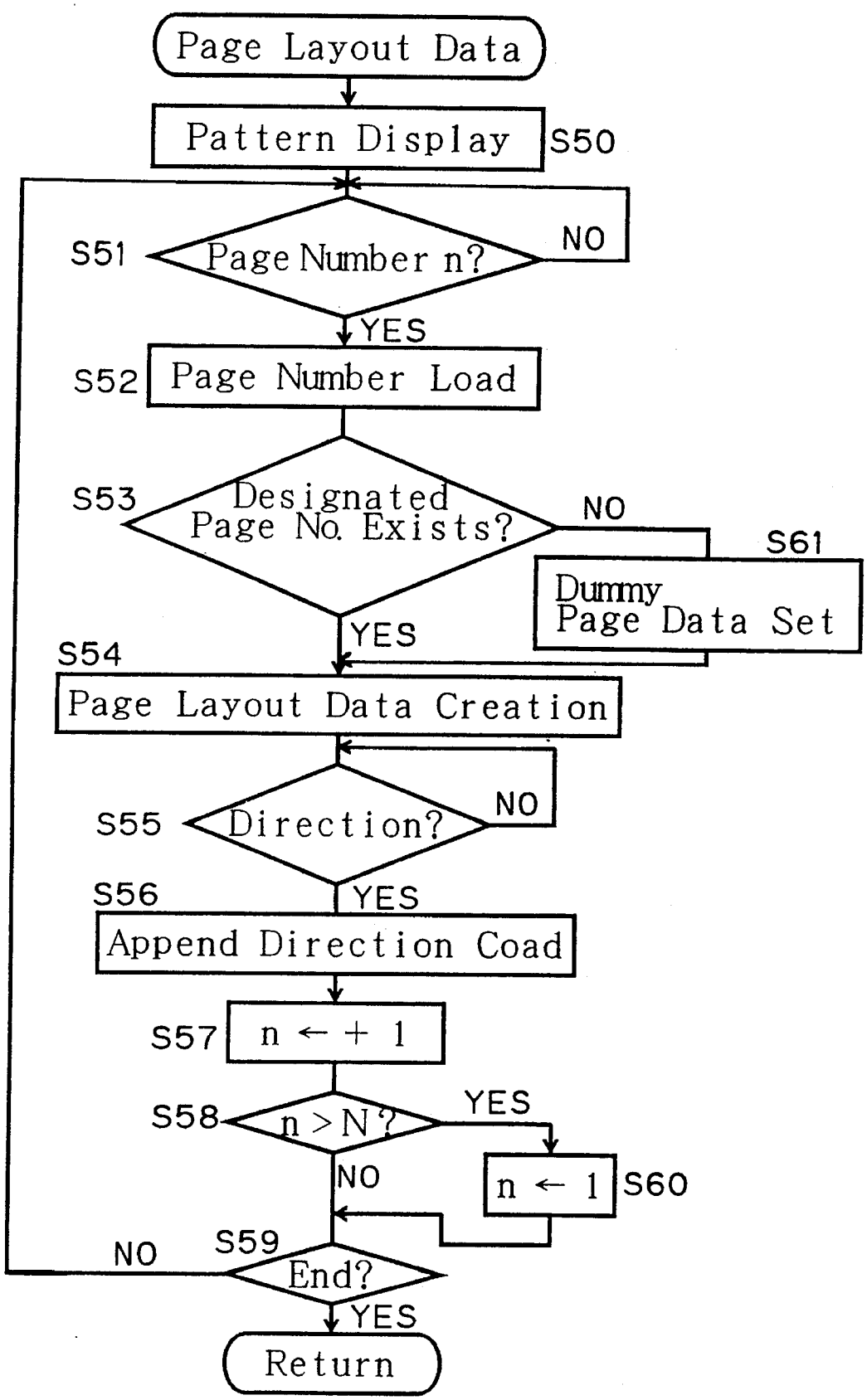
FIG. 22 is a flowchart representing an alternate execution of the process depicted in FIG. 10.

In the execution example above, by inputting the 1st page number in multiple one page units only, the layout of a page data and layout of a dummy page data will execute although an assigned position for every page data each page can be specified. Another example of a page layout data creation process of step S8 in FIG. 8 is shown in FIG. 22.

In this page layout data creation process, at first, in step S50, a pattern will display that corresponds to information for imposition as shown in FIG. 24. At this point, in pattern 71 shown in FIG. 24, a numeric value of upper display region 71a of each page assignment position will indicate the page numbers and downward facing arrow 71b will indicate the top and bottom directions of the applicable pages.

In step S51, an input is awaited that specifies which page will be assigned to the assigned position [n=(1)]. In the example shown in FIG. 12, numeric value "5" is input here. In step S52, page number "5" input in step S51 loads. Next, in step S53, a judgement is made on whether or not the page data of the page (page 5) that was specified is already being created by page data creation device 1. Further, this judgement is made using established page numbers related to each page data. If the page data is being created, the operation flow moves to step S54 and page layout data is created to lay out the page data of the 5th page at the assigned position (1) in FIG. 24.

Next, in step S55, an input is awaited that will assign the top and bottom direction of the 5th page to the assigned position (1). As shown in FIG. 24, in the initial state, the direction of the pages are all set to the top. When the setting is reversed here, the direction code indicating the reversed direction will be appended in step S56 and, simultaneous with that, the direction of the arrows in the pattern display will be changed to the reversed direction. In this example however, the direction of the 5th page can remain to the top so the reversed direction is not specified. Next, in step S57, numerical value n that indicates the assigned position increments and the operation flow moves to step S58. In step S58, a judgement is made on whether or not N [8] in the example shown in FIG. 24) that previously set the assigned position was exceeded.

If N was not exceeded, the operation flow moves from step S58 to step S59 and a judgement is made on whether or not the key to end this process was pressed. If the key was not pressed, the operation flow returns to step S51 and the page allocation process concerning the next assigned position (2) executes identical to the explanation above.

If the assigned position n exceeded N here (exceeded [8] in the example shown in FIGS. 12 and 24), the operation flow moves from step S58 to step S60. In step S60, assigned position n is reset to (1) and processes on and after step S51 are repeated. By repeatedly carrying out the imposition process to each assigned position in this way, the pattern display becomes the display shown in FIG. 24 (B). The display shown in FIG. 24 (B) corresponds to the layout of the surface of printed matter 70 in FIG. 12 (A).

Page 13 shown in the example of FIG. 12 may be, for instance, an advertisement page and when original film is separately supplied, the page data of this page 13 cannot be created by page data creation device 1. For this case, the page number (13) at the assigned position (6) loads in step S52 and, in step S53, if there is a judgement that the page data of the data that was specified is not created, the operation flow moves from step S53 to step S61. In step S61, the set process for dummy page data executes.

Figure 23:
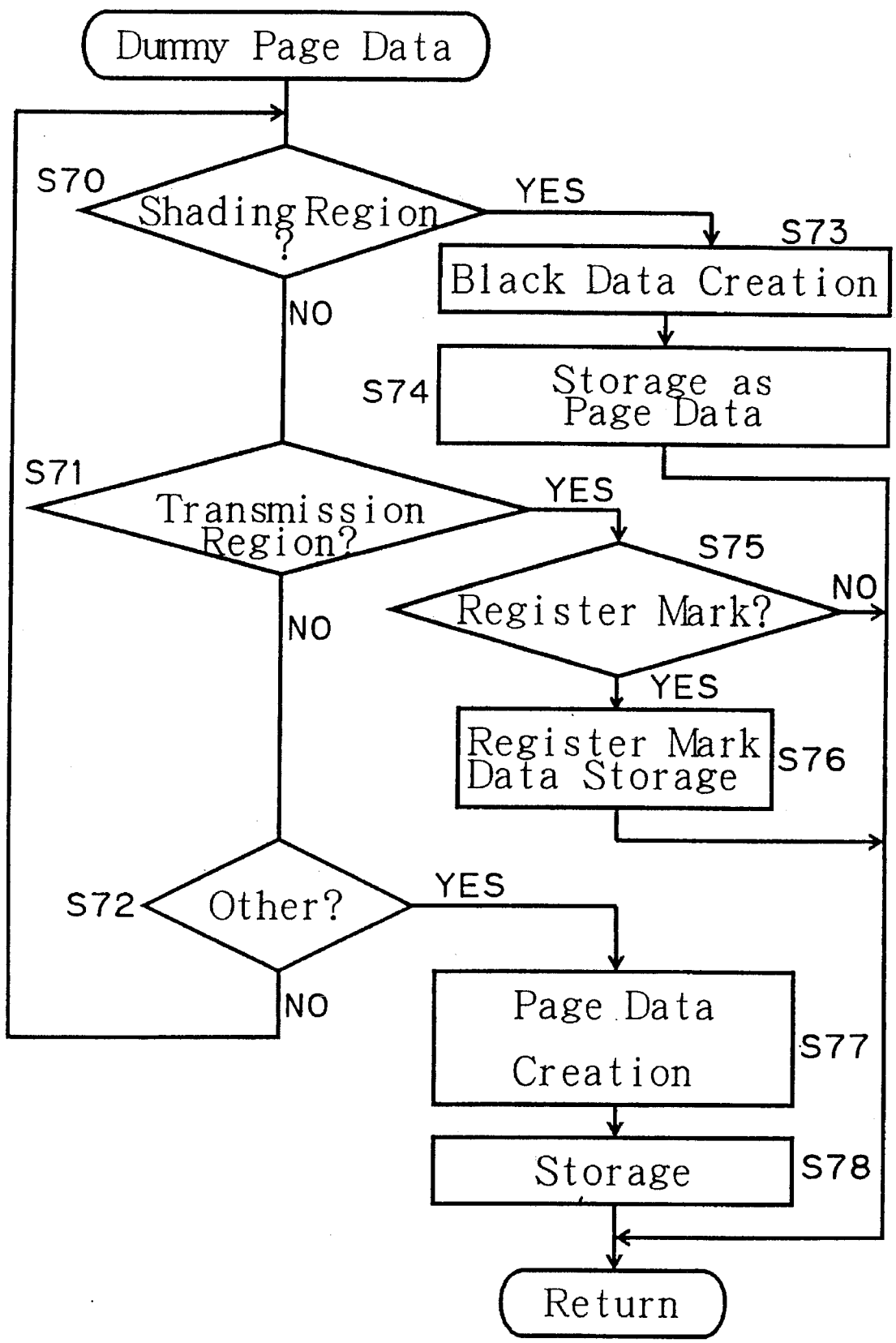
FIG. 23 is a flowchart representing an alternate execution of the process depicted in FIG. 11.

FIG. 23 shows the set process of a dummy page data. For this case, in step S70, a judgement is made on whether or not data for shading mask creation is treated as a dummy page data. Also, in step S71, a judgement is made on whether or not data for transparent region creation is treated as a dummy page data. Further, in step S72, a judgement is made on whether or not other data is treated as a dummy page data. Other data is defined as information selected as data such as a type of document assigned to, for example, page 13.

When data for shading mask creation is selected as the dummy page data, the operation flow moves from step S70 to step S73 and black data is created in step S73. In step S74, the created data is stored as a page data to layout at the corresponding assigned position. FIG. 13 shows original film that was created using this dummy page data. In this example, shading mask SM is created at the assigned position of page 13. Further, when data to create a transparent region is selected as a dummy page data, the operation flow moves from step S71 to step S75. In step S75, a judgement is made on whether or not a register mask is stored. If there is a YES judgement in step S75, the operation flow moves to step S76 and register mask data is stored identical to the explanation above.

In contrast to this, if there is a NO judgement in step S75, no data will be created. In other words, for this case, nothing is output as a page data for page 13 so on the original film, page 13 is a totally transparent region. When blank data (transparent region) and register mask are selected as a dummy page data, original film F2 will be created as shown in FIG. 14. The assigned position of page 13 becomes PR here and register mask R is stored at that area. When other data is selected in step S72, other data is created in step S77 and stored in step S78.

When data is created in units of 16 pages as in this example, the front and rear or the original film is created that corresponds to the printing paper shown in FIG. 12.

In the execution example above, data creation device 1 is connected with exposure device 8 et al., via network line NL for sending data. Alternatively, storage media such as floppy disk may be used for transference of data.

In the execution example above, the exposure device includes a belt transport mechanism. However, a general contact printer or the like may be utilized.

In the execution example above, for any case, after imposition data consisting of multiple page data is imposed on photo-sensitive original film is created, a printing plate is created using the created original film. A printing plate scanning exposure device that directly exposes the printing plate using laser scanning exposure and outputs the image can also be used.

For this case, if the page data is not prepared, instead of selecting each type of dummy page data such as data to create a shading mask on the printing plate and laying out a shaded region, an unexposed region can be laid out. However, in order to shorten the exposure time in the printing plate scanning exposure device, special printing plates with higher sensitivity than normal printing plates are used quite often. Because of this, when another original film is exposed in an unexposed region by an exposure device such as a belt transport type multiple exposure device, it is necessary to set a different exposure time during the exposure of a normal printing plate although, these exposure times can be tested in advance.

In the imposition data creation device of a first aspect of the present invention, page layout data is output to the exposure device by the information output method. Consequently, in the exposure device, original film can be positioned using that output page layout data. Because of this, the exposure operation in the exposure device is made more accurate and efficient.

In a second aspect of the imposition data creation device of the present invention, if the page data is not prepared, in order to layout a dummy page data, the applicable area is regarded as a shaded region in place of the page data with the page layout data of the dummy page data areas being sent to the exposure device. As a result, the original film prepared later can be automatically positioned at the dummy page data area in accordance with the page layout data, making the exposure operation more accurate and efficient.

In a third aspect of the imposition data creation device of the present invention, page layout data is output to the exposure device by the information output method. Consequently, in the exposure device, original film can be positioned using that output page layout data. Because of this, the exposure operation in the exposure device is made more accurate and efficient.

In a forth aspect of the imposition data creation device of the present invention, if the page data is not prepared, in order to layout a dummy page data, the applicable area is regarded as an unexposed region in place of the page data with the page layout data of the dummy page data areas being sent to the exposure device side. Consequently, the original film prepared later can be automatically positioned at the dummy page data area in accordance with the page layout data, making the exposure operation more accurate and efficient on the exposure device side.

In a fifth aspect of the present invention, in the platemaking system, original film can be moved based on the page layout data sent from the imposition data creation device on the exposure device side therefore making the positioning operation of the original film unnecessary. As a result, the efficiency of the exposure operation is improved.

In a sixth aspect of the invention, if a page data is not prepared, in order to layout a dummy page data, a shaded region is created in place of the page data with the page layout data of the dummy page data areas being sent to the exposure device side. As a result, the original film can be automatically moved to the corresponding position making the exposure operation easier.

In a seventh aspect of the invention, the exposure device is further provided with a shading method. This method allows exposure of dummy page data areas only during exposure using original film prepared later. Also, during the exposure, the efficiency is improved even more. Further, the shading method can be controlled by the page layout data.

Figure 25:
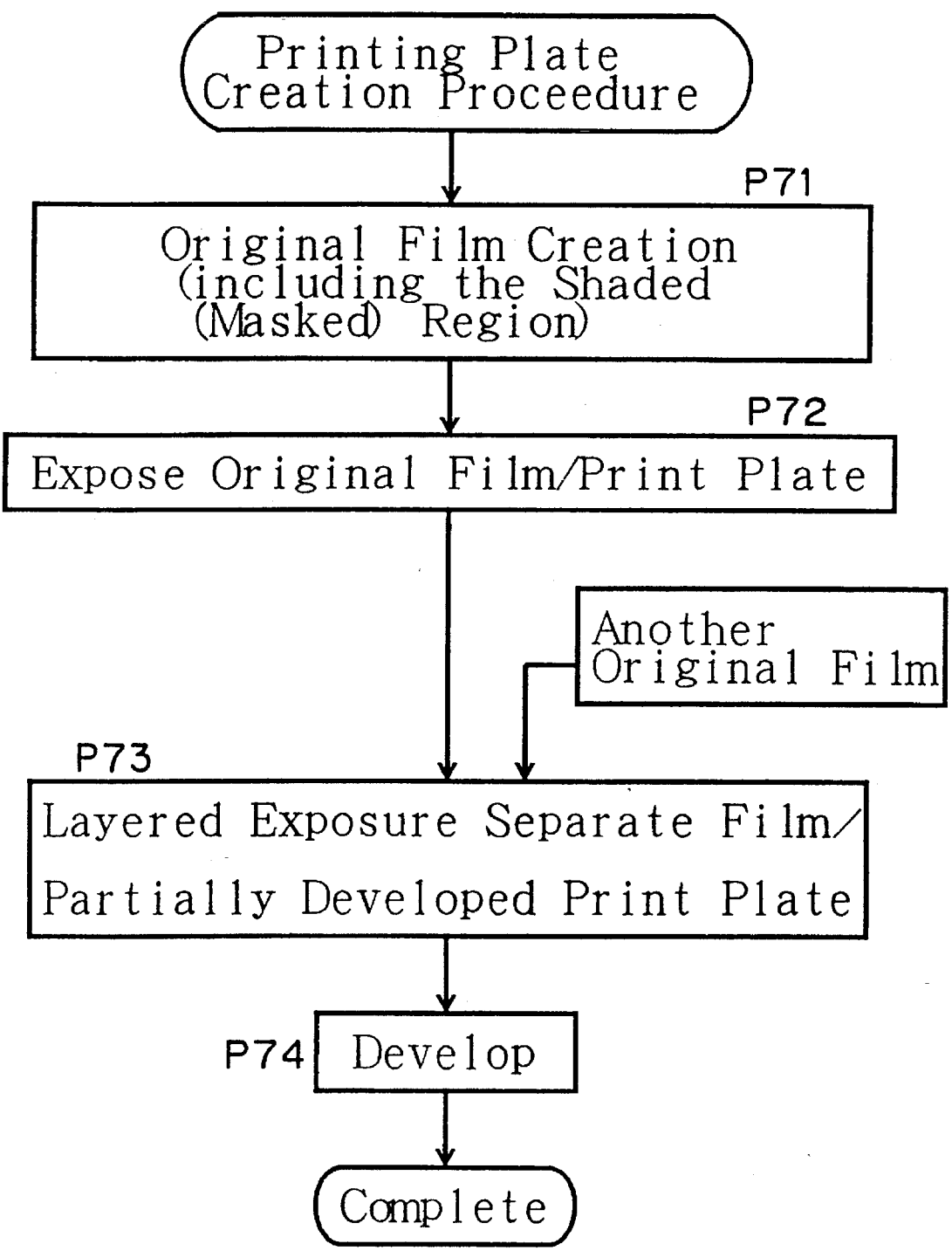
FIG. 25 is a flowchart depicting the steps necessary for producing an original film according to an alternate process of the present invention.
Figure 26:
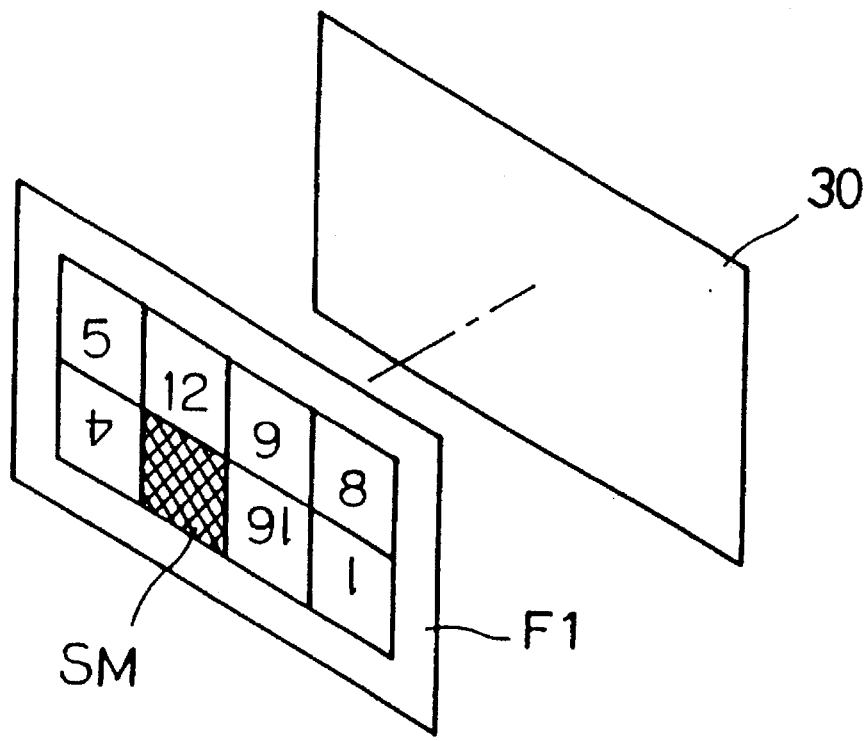
FIG. 26 is a perspective view of an original film and a printing plate demonstrating the process depicted in FIG. 25.
Figure 27:
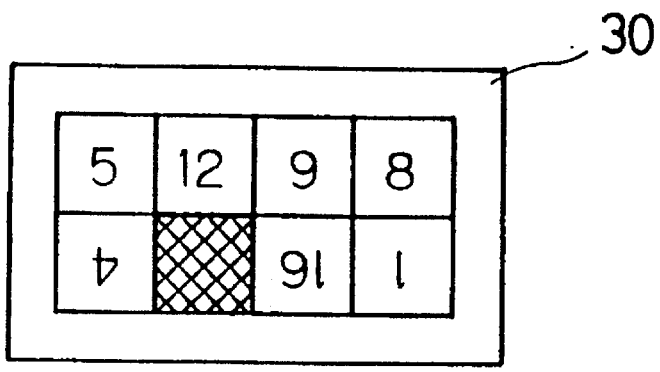
FIG. 27 is a plane view of the printing plate depicted in FIG. 26.
Figure 28:
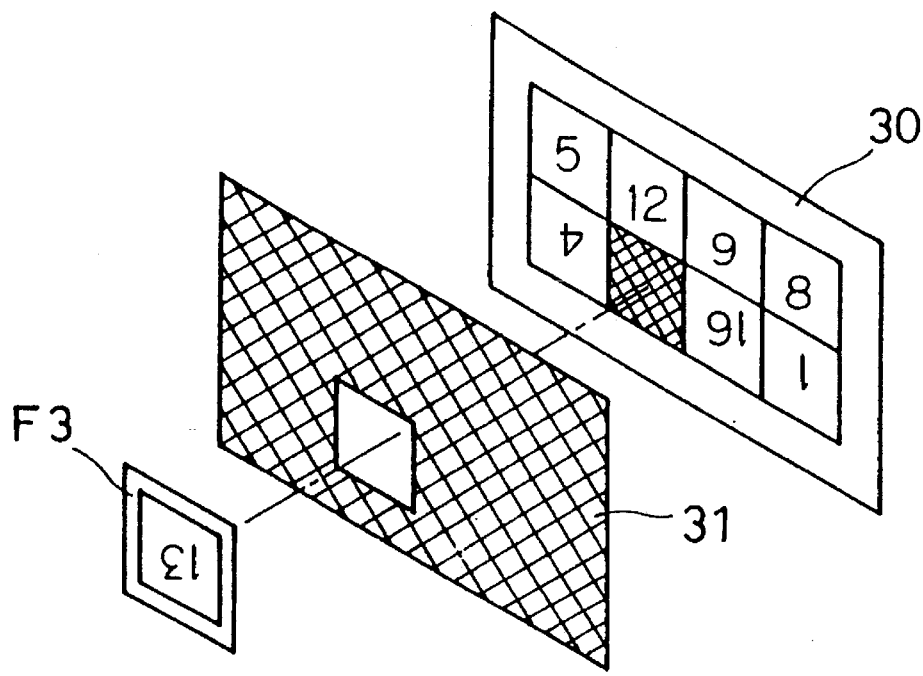
FIG. 28 is a perspective view showing a superimpose exposure process using the method demonstrated in FIG. 25.

Next, the procedure to create a printing plate using the original film obtained by the process above will be explained. At first, using FIG. 25, the procedure to create a printing plate when a shading mask is created on one part of the original film will be explained. In process P71, original film F1 is created that has shading mask M created in one area as explained above. Next, in process P72, the first exposure is done for printing plate 30 using original film F1 obtained in process P71 as shown in FIG. 26. FIG. 27 shows what printing plate 30 exposed in process P72 would look like with only the assigned position of the 13the page unexposed.

Figure 29:
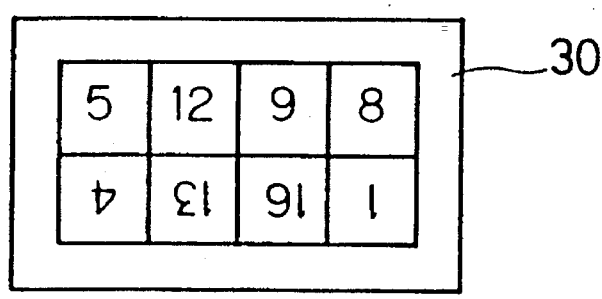
FIG. 29 is a plane view showing a printing plate depicted in FIG. 28.

Next, in process P73, using original F1, for example an advertisement of the 13the page separately supplied, printing plate 30 exposed in said process P72 has a superimposed exposure. At this point, in order to mask the areas that already completed exposure, mask 31, which has one transparent hole, is used. Further, when the exposure is done using an exposure device that has an automatic mask device, mask 31 is not necessary. Printing plate 30 shown in FIG. 29 is obtained this way. After these processes, in process P74, the film is developed completing the printing plate operation.

Further, in the printing plate operation, the size of the printing plate and equal sized exposure are done making it necessary to expose small sized original film such as advertisement film F3 at the accurate position. For this case, a page-makeup machine must be used between a frame exposure device and impositioning device such as that described with respect to the first embodiment, above.

Figure 30:
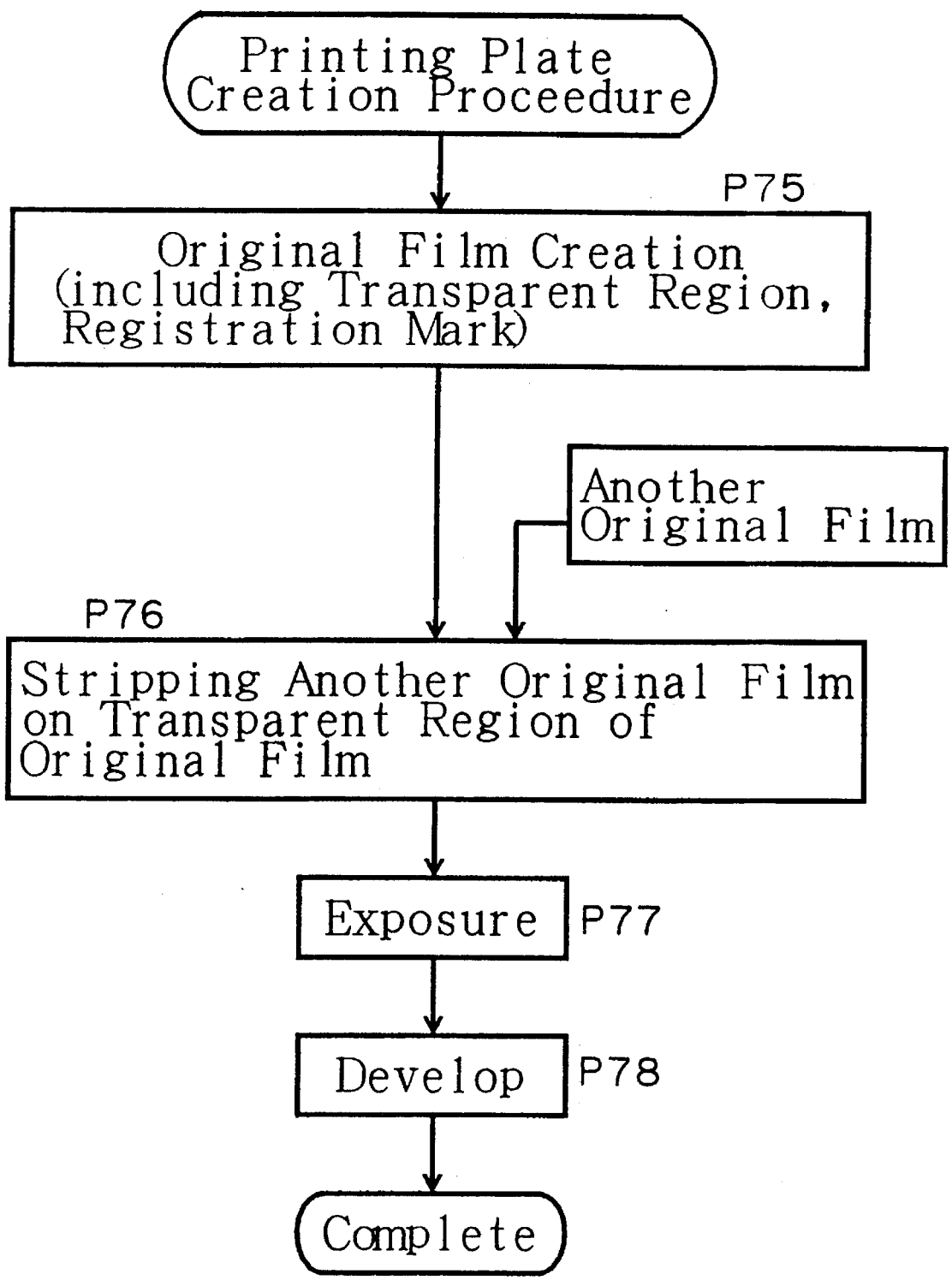
FIG. 30 is a flowchart depicting the further steps necessary for producing an original film according to the process demonstrated in FIG. 25.

Next, using FIG. 30, the procedure to create a printing plate using original film F2 that has a transparent region created in one part of the original film will be explained. At first, in process P75, original film F2 is created that has transparent region P created in one area as explained above. Next, in process P76, separately supplied advertisement of the 13the page is attached to transparent region P of the original film. At this point, register mark R used for registration is recorded on original film F2 and the separately supplied film. By this action, the stripping operation is simple and accurate.

Next, in process P77, exposure is carried out using the original film obtained as stated above. After this exposure operation, in process P78, the development operation is carried out and, as shown in FIG. 29, a printing plate created. In this execution example, if a page is included that does not have a page data, data for one original film can be automatically output during the imposition. Further, by assigning data used to create a shading mask to unprepared page data as a dummy page data, another page data can be exposed without the use of a separate shading mask. Moreover, by assigning data used to create a transparent region as a dummy page data, areas where a page data is not prepared can have separately supplied film pasted up and be considered as one original film. For these cases, because no ink is printed on the transparent region during color correction, color correction can be carried out at other areas only excluding applicable areas. In addition, by recording a register mark on the transparent region, the stripping operation can be accurately and simply carried out.

In the process described above, the assigned position for every page data each page may be specified as previously described with respect to FIGS. 10 and 11 by inputting the 1st page number in multiple one page units only, the layout of a page data and layout of a dummy page data will execute.

If the above process is carried out, page data layout and dummy page data layout can be automatically carried out by inputting the 1st page number.

In this invention as described above, when imposition data is created, if a page data is not prepared, a dummy page data will be laid out in place of the page data so even if the page data of each page are not complete, imposition data for completed page data can be easily created.

Further, when imposition data for completed page data is created and that data is output to original film, stripping and exposure processes carried out later can be accurately and easily handled.

Although the present invention has been described in connection with preferred embodiments thereof, many variations and modifications will now become apparent to those skilled in the art. Therefore, the present invention is not limited solely to the specific disclosure.

What is claimed:

1. A method for creating a printing plate for use in the production of printed matter, comprising the steps of:

inputting page data into an imposition data creation device;

generating multiple pages of page data, including dummy page data where at least one page of page data has not been inputted;

producing images on a photosensitive film to produce an original film having images thereon representing the generated page data, wherein at least one portion of said original film also defines a masked area that corresponds to the dummy page data;

exposing at least a portion of a printing plate to the original film to transfer images from the original film to the printing plate, wherein the masked area of the original film causes a portion of the printing plate to remain unexposed and corresponds to the dummy page data;

supplying an additional original film having an additional page of page data formed thereon;

positioning the additional original film with respect to the printing plate in the area corresponding to the dummy page data; and exposing only the area of the printing plate corresponding to the dummy page data to the additional original film.

2. An image forming device, comprising:

an input device for inputting page data and information on imposition of the page data;

dummy page data setting device for setting predetermined dummy page data, said dummy page data adapted to form a shaded region on a corresponding photosensitive film in place of page data when at least one of the page data has not been inputted;

page data layout device for creating imposition data for laying out in combination page data and dummy page data corresponding to said imposition information; and an output device for forming images on photosensitive film using said page data and said dummy page data in combination where each one of said page data being used to form images on said photosensitive film and said dummy page data being used to form a shaded region on said photosensitive film which shaded region serves as a mask.

3. An image forming device of claim 2, wherein said page data layout device is connected to an exposure device.

4. A data creation method for creating imposition data for laying out page data corresponding to a predetermined layout of multiple pages of data, where each page of page data is formed on a photosensitive film by an output device, and said film being used to create a printing plate, comprising the steps of:

inputting multiple pages of page data and information on imposition of the page data to produce dummy data and page data;

setting dummy page data to form a shaded region on a corresponding portion of a photosensitive film, said shaded region on said photosensitive film resulting in an unexposed region on a subsequently produced printing plate; and creating imposition data by laying out the page data and the dummy page data corresponding to the imposition information for subsequent forming of images on the photosensitive film, the images on the photosensitive film corresponding to the page data and the shaded region.

5. The method in accordance with claim 4 further comprising the step of:

determining page data in response to said inputted information where each page number corresponds to page data inputted for that page.

6. A platemaking system that creates a printing plate for use in production of printed matter, comprising:

an input device for inputting multiple pages of page data and information corresponding to imposition of the multiple pages of page data;

a data creation device connected to said input device, said data creation device for creating page layout data for determining a layout of each page of page data and for creating imposition and position data for the imposition of page data and dummy page data, the dummy page data created for selected page or pages where page data has not been inputted;

an output device connected to said data creation device, said output device for forming on photosensitive film images representing the data created by said data creation device to produce original film, where each of the pages of page data is formed on a corresponding photosensitive film and said dummy data forms a shaded region on the photosensitive film to create a mask;

an exposure device connected to said data creation device, said exposure device for receiving positioning and size information about each page of the page layout data, and for positioning each original film created by said output device relative to a printing plate disposed in said exposure device in response to the positioning and size information from said data creation device, and said exposure device for exposing the exposed portions on the printing plate and a masked portion, and for subsequently positioning another original film in response to the positioning and size information from said data creation device, the other original film used for replacing the masked portion with page data and for exposing the masked portion to the printing plate.

7. The platemaking system of claim 6, wherein said exposure device includes a mask device.

8. The platemaking system of claim 6, wherein said positioning means includes a transport belt which operates to transport original film.

9. The platemaking system of claim 6, wherein said exposure device has an exposure control assembly which includes a microcomputer.

10. A method for creating a printing plate for use in production of printed matter, comprising:

inputting multiple pages of page data and information corresponding to the imposition of the page data into a data creation device using an input device;

creating page layout data for determining a layout and position of each page of page data on photosensitive film, each page corresponding to inputted information;

preparing dummy page data in place of page data where there is no inputted page data;

creating imposition data by imposing page data and dummy page data corresponding to said page layout data in the data creation device;

creating original film by forming on photosensitive film images corresponding to the imposition data, where the imposition data corresponding to each page of page data formed on the photosensitive film and the imposition data corresponding to dummy page data formed on the photosensitive film as a shaded region;

mounting the original film in an exposure device having a positioning mechanism for moving and positioning the original film with respect to a printing plate positioned in the exposure device;

obtaining positioning and size information about each page in said exposure device from said page layout data;

positioning the original film relative to the printing plate, the positioning effect by the positioning mechanism based upon positioning and size information of each page determined in said creating steps, said positioning mechanism controlled by an exposure device control assembly;

exposing the printing plate to the original film to transfer the images on the original film to the printing plate;

mounting an additional original film in the exposure device, the additional original film having an image corresponding to the shaded region in the original film;

positioning the other original film to a position corresponding to the shaded region of the printing plate the positioning effected by the positioning mechanism based upon positioning and size information of said page layout data determined in said creating steps, said positioning mechanism controlled by an exposure device control assembly; and exposing the printing plate for transferring an image on the other original film onto the previously shaded region of the printing plate.

* * * * *